United States Patent
Patil et al.

(10) Patent No.: US 10,263,587 B2
(45) Date of Patent: Apr. 16, 2019

(54) PACKAGED RESONATOR WITH POLYMERIC AIR CAVITY PACKAGE

(71) Applicant: Avago Technologies General IP (Singapore) Pte. Ltd., Singapore (SG)

(72) Inventors: Vikram Patil, Fort Collins, CO (US); John Choy, Westminster, CO (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 15/445,643

(22) Filed: Feb. 28, 2017

(65) Prior Publication Data

US 2018/0183406 A1     Jun. 28, 2018

Related U.S. Application Data

(63) Continuation-in-part of application No. 15/390,430, filed on Dec. 23, 2016.

(51) Int. Cl.
| | | |
|---|---|---|
| *H03H 9/17* | (2006.01) | |
| *H03H 3/02* | (2006.01) | |
| *H03H 9/02* | (2006.01) | |
| *H03H 9/10* | (2006.01) | |

(52) U.S. Cl.
CPC .......... *H03H 3/02* (2013.01); *H03H 9/02118* (2013.01); *H03H 9/1014* (2013.01); *H03H 9/173* (2013.01); *H03H 2003/021* (2013.01)

(58) Field of Classification Search
CPC ............... H03H 3/02; H03H 2003/021; H03H 2003/023; H03H 9/1014; H03H 9/17

USPC .................................................. 333/187, 189
See application file for complete search history.

(56) References Cited

U.S. PATENT DOCUMENTS

| | | |
|---|---|---|
| 5,587,620 A | 12/1996 | Ruby et al. |
| 5,873,153 A | 2/1999 | Ruby et al. |
| 6,107,721 A | 8/2000 | Lakin |
| 6,265,246 B1 | 7/2001 | Ruby et al. |
| 6,376,280 B1 | 4/2002 | Ruby et al. |
| 6,429,511 B2 | 8/2002 | Ruby et al. |
| 6,507,983 B1 | 1/2003 | Ruby et al. |
| 6,714,102 B2 * | 3/2004 | Ruby ................ H03H 3/02 181/293 |
| 6,777,263 B1 | 8/2004 | Gan et al. |
| 6,787,897 B2 | 9/2004 | Geefay et al. |
| 6,828,713 B2 | 12/2004 | Bradley et al. |
| 6,955,950 B2 | 10/2005 | Aigner et al. |
| 6,979,597 B2 | 12/2005 | Geefay et al. |
| 7,280,007 B2 | 10/2007 | Feng et al. |
| 7,300,823 B2 | 11/2007 | Franosch et al. |
| 7,345,410 B2 | 3/2008 | Grannen et al. |
| 7,358,831 B2 | 4/2008 | Larson, III et al. |

(Continued)

OTHER PUBLICATIONS

Co-pending U.S. Appl. No. 15/335,402, filed Oct. 26, 2016.

(Continued)

*Primary Examiner* — Dean O Takaoka

(57) ABSTRACT

A packaged resonator includes a substrate, an acoustic stack, a first polymer layer and a second polymer layer. The acoustic stack is disposed over the substrate. The first polymer layer is disposed over the substrate surrounding the acoustic stack. The first polymer layer also provides a first air gap above the acoustic stack. The second polymer layer is disposed over the acoustic stack and above the first air gap.

17 Claims, 15 Drawing Sheets

(56) References Cited

U.S. PATENT DOCUMENTS

| | | | |
|---|---|---|---|
| 7,369,013 B2 | 5/2008 | Fazzio et al. | |
| 7,388,454 B2 | 6/2008 | Ruby et al. | |
| 7,443,270 B2* | 10/2008 | Motai | H03H 3/02 310/312 |
| 7,498,900 B2* | 3/2009 | Lee | H01L 27/0805 333/133 |
| 7,561,009 B2 | 7/2009 | Larson, III et al. | |
| 7,562,429 B2* | 7/2009 | Larson, III | H03H 3/02 216/13 |
| 7,629,865 B2 | 12/2009 | Ruby et al. | |
| 7,646,035 B2 | 1/2010 | Loh et al. | |
| 7,692,317 B2 | 4/2010 | Franosch et al. | |
| 7,714,684 B2 | 5/2010 | Ruby et al. | |
| 7,791,434 B2 | 9/2010 | Fazzio et al. | |
| 7,863,699 B2* | 1/2011 | Dropmann | H01L 23/66 257/254 |
| 8,102,044 B2 | 1/2012 | Ruby et al. | |
| 8,188,810 B2 | 5/2012 | Fazzio et al. | |
| 8,230,562 B2 | 7/2012 | Fazzio et al. | |
| 8,248,185 B2 | 8/2012 | Choy et al. | |
| 8,269,291 B2 | 9/2012 | Buchwalter et al. | |
| 8,436,516 B2 | 5/2013 | Ruby et al. | |
| 8,648,671 B2* | 2/2014 | Son | H03H 3/04 310/324 |
| 8,669,572 B2 | 3/2014 | Leung et al. | |
| 8,673,121 B2 | 3/2014 | Larson, III et al. | |
| 8,902,023 B2 | 12/2014 | Choy et al. | |
| 8,981,876 B2 | 3/2015 | Jamneala et al. | |
| 9,136,819 B2 | 9/2015 | Grannen et al. | |
| 9,197,185 B2 | 11/2015 | Zou et al. | |
| 9,243,316 B2 | 1/2016 | Larson, III et al. | |
| 9,450,167 B2 | 9/2016 | Zou et al. | |
| 9,455,681 B2 | 9/2016 | Feng et al. | |
| 9,479,139 B2 | 10/2016 | Ruby et al. | |
| 9,484,882 B2 | 11/2016 | Burak et al. | |
| 9,590,165 B2 | 3/2017 | Zou et al. | |
| 9,602,073 B2 | 3/2017 | Grannen et al. | |
| 9,679,765 B2 | 6/2017 | Larson, III et al. | |
| 2006/0096945 A1 | 5/2006 | Shen | |
| 2007/0205850 A1 | 9/2007 | Jamneala et al. | |
| 2009/0096321 A1 | 4/2009 | Aikawa et al. | |
| 2010/0096745 A1 | 4/2010 | Ruby et al. | |
| 2011/0180391 A1 | 7/2011 | Larson, III et al. | |
| 2011/0266925 A1 | 11/2011 | Ruby et al. | |
| 2012/0177816 A1 | 7/2012 | Larson, III et al. | |
| 2012/0274183 A1 | 11/2012 | Sinha et al. | |
| 2012/0326807 A1 | 12/2012 | Choy et al. | |
| 2013/0015747 A1 | 1/2013 | Ruby et al. | |
| 2013/0049545 A1 | 2/2013 | Zou et al. | |
| 2013/0176086 A1* | 7/2013 | Bradley | H03H 9/1007 333/189 |
| 2014/0118090 A1 | 5/2014 | Grannen et al. | |
| 2014/0132117 A1 | 5/2014 | Larson, III et al. | |
| 2014/0175950 A1 | 6/2014 | Zou et al. | |
| 2014/0225682 A1 | 8/2014 | Burak et al. | |
| 2014/0292150 A1 | 10/2014 | Zou et al. | |
| 2014/0333177 A1* | 11/2014 | Guillou | H01L 41/0533 310/321 |
| 2014/0354109 A1 | 12/2014 | Grannen et al. | |
| 2015/0207489 A1 | 7/2015 | Bi et al. | |
| 2015/0244347 A1 | 8/2015 | Feng et al. | |
| 2015/0311046 A1 | 10/2015 | Yeh et al. | |
| 2017/0063329 A1 | 3/2017 | Gilbert et al. | |
| 2017/0063331 A1 | 3/2017 | Gilbert et al. | |
| 2017/0063333 A1 | 3/2017 | Gilbert et al. | |
| 2017/0063339 A1 | 3/2017 | Burak et al. | |
| 2018/0183406 A1 | 6/2018 | Patil et al. | |

OTHER PUBLICATIONS

Co-pending U.S. Appl. No. 15/639,124, filed Jun. 30, 2017.
Co-pending U.S. Appl. No. 15/661,468, filed Jun. 27, 2017.
Non-Final Office Action dated Jan. 4, 2019 for U.S. Appl. No. 15/720,273, 14 pgs.

* cited by examiner

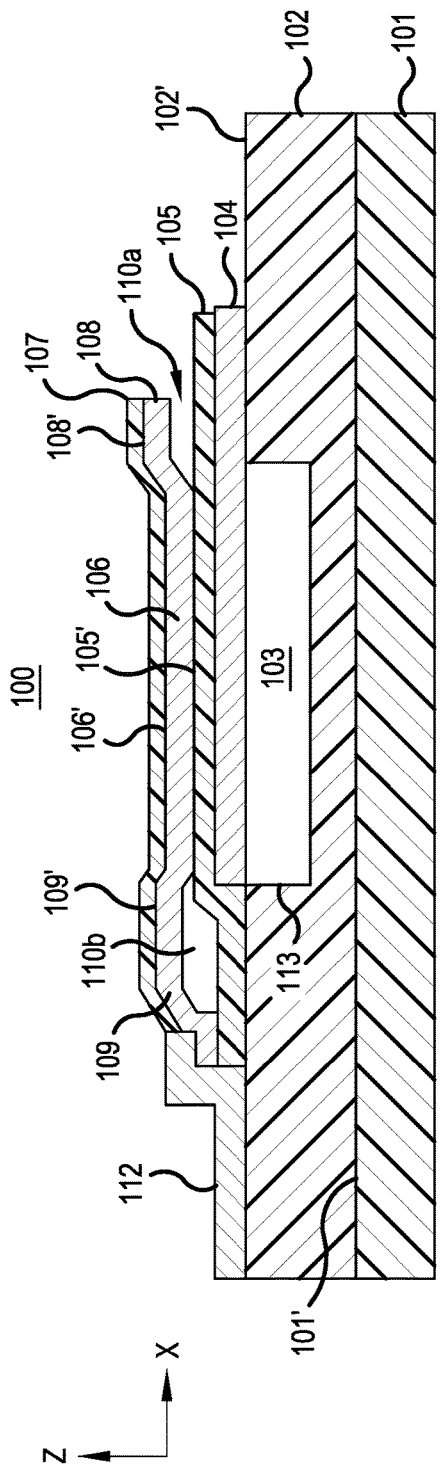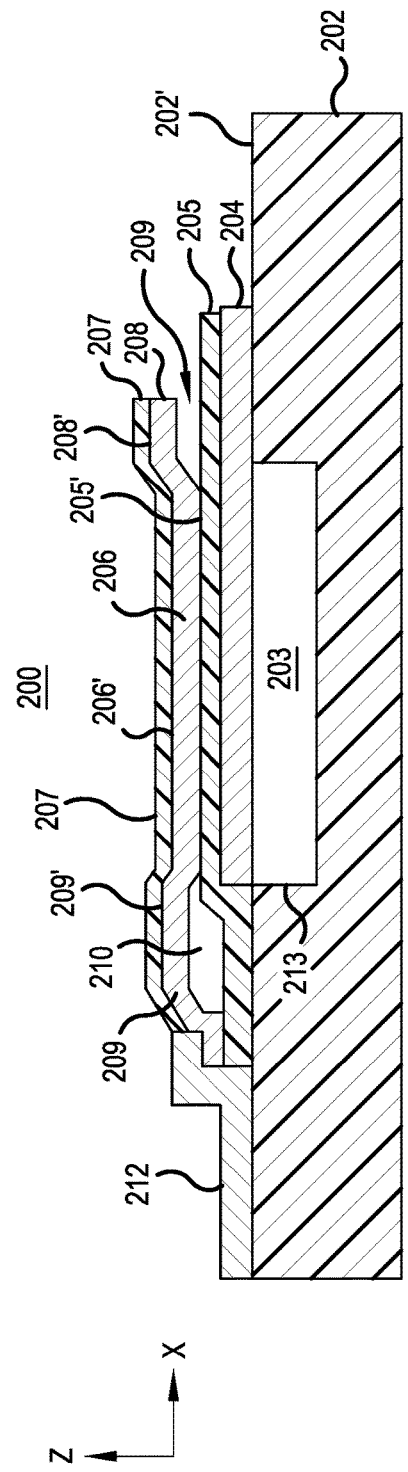

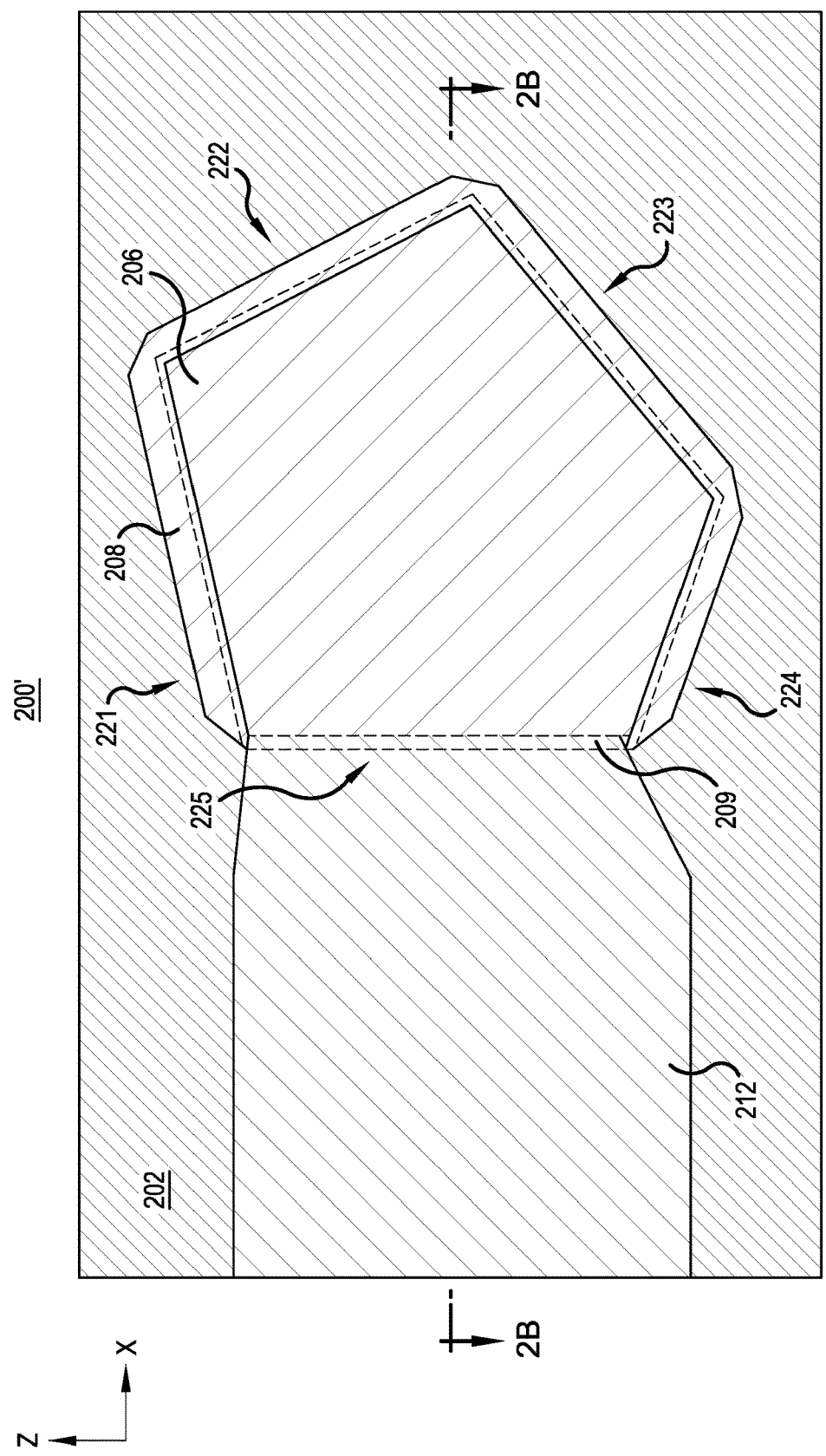

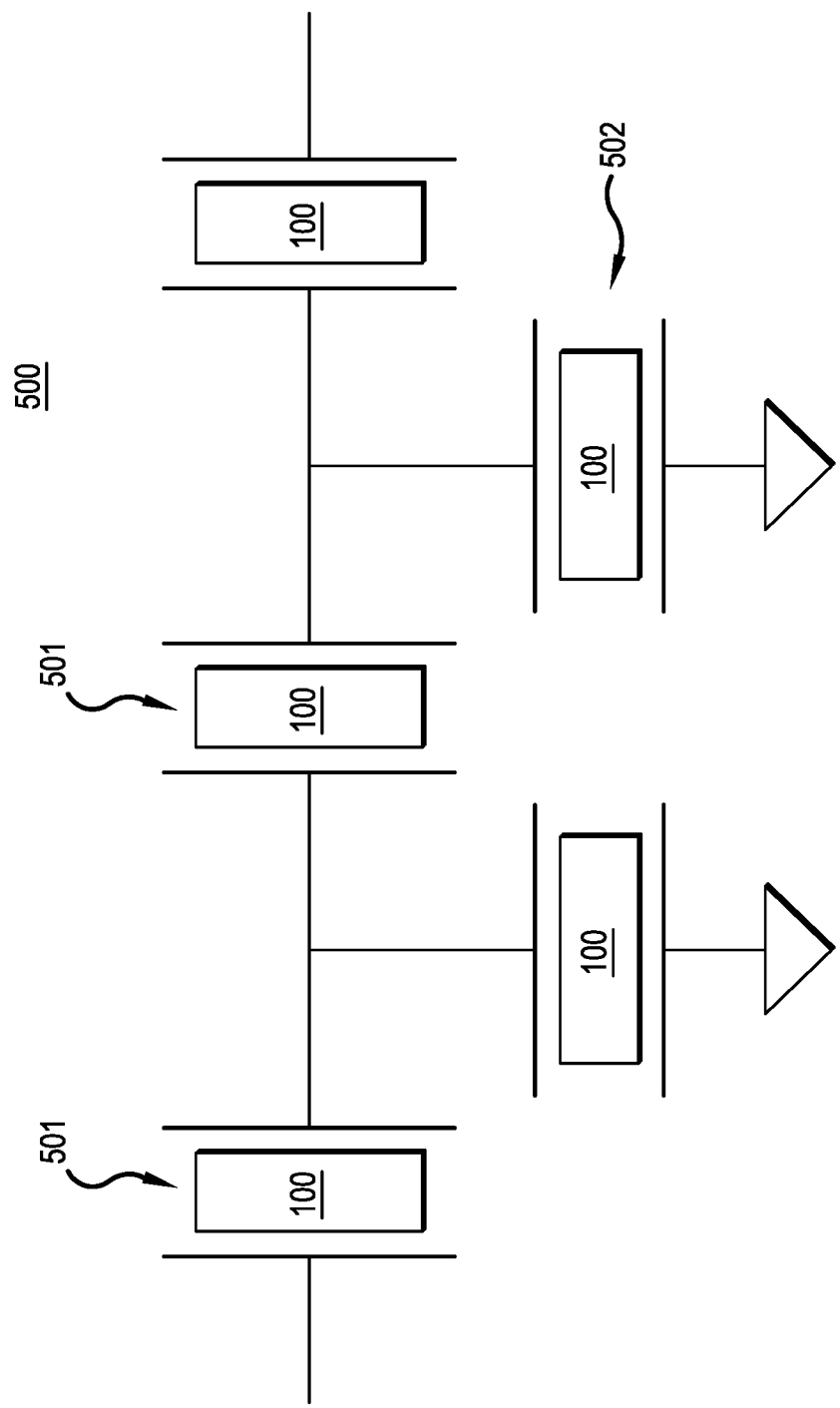

PACKAGED RESONATOR WITH POLYMERIC AIR CAVITY PACKAGE

CROSS-REFERENCE TO RELATED APPLICATIONS

The present application is a continuation-in-part application under 37 C.F.R. § 1.53(b) of commonly owned U.S. patent application Ser. No. 15/390,430 to Chris Feng, et al., entitled "Bulk BAW Resonator Having Electrically Insulating Substrate," and filed on Dec. 23, 2016. The entire disclosure of U.S. patent application Ser. No. 15/390,430 is specifically incorporated herein by reference, and for all purposes.

BACKGROUND

Electrical resonators are used in many electronic applications. For example, acoustic resonators are an enabling technology for radio frequency (RF) mobile communications. In many wireless communications devices, RF as well as microwave frequency resonators are used as filters to improve reception and transmission of signals. Acoustic resonators act as low loss and high fidelity filters for the many frequency bands upon which modern mobile communications are based. Filters typically include inductors and capacitors, and more recently resonators. As applied in RF filtering for mobile communications, acoustic resonators typically require stable and accurate frequency tuning, high Q values, and low nonlinearities.

As will be appreciated, it is desirable to reduce the size of components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves are converted into electrical waves for use in electrical applications.

One type of piezoelectric resonator is a Bulk Acoustic Wave (BAW) resonator. The BAW resonator has the advantage of small size and lends itself to Integrated Circuit (IC) manufacturing tools and techniques. The BAW includes an acoustic stack. The acoustic stack includes, inter alia, a layer of piezoelectric material disposed between two electrodes. Acoustic waves achieve resonance across the acoustic stack, with the resonant frequency of the waves being determined by the materials in the acoustic stack.

Film bulk acoustic resonators (FBAR) filters are a form of BAW filters. FBAR filters are state of the art for acoustic resonators. FBAR technology is characterized by superior performance in terms of Q over frequency, effective coupling coefficient kt2, and precise frequency control. These FBAR performance characteristics translate to superior product performance in terms of (low) insertion loss, (satisfactory) roll off characteristics at filter edge, (optimum) isolation, and (highest) nonlinearity performance.

FBARs include a piezoelectric layer sandwiched between two metal electrodes, i.e., a top metal electrode and a bottom metal electrode. FBARs are placed above an air cavity, and rely on air cavity packaging technology to achieve required performance characteristics. As a result, air cavities below FBARs must necessarily be robust and must not interfere with the resonator frequency centering, Q values, or nonlinearities.

Many BAW resonators, including FBARs, include a substrate made of a semiconductor material, such as silicon. Electromagnetic fields generated in the acoustic stack, for example, can induce currents in the semiconductor substrates. These induced currents themselves generate electromagnetic radiation that can interfere with the desired electrical signals of the resonator and can degrade the performance of devices (e.g., filters) that incorporate the resonator. For example, these induced currents can contribute to intermodulation distortion (IMD), which is a measure of linearity for a wide range of radio frequency (RF) and microwave components. Fundamentally, IMD describes the ratio (in dB) between the power of fundamental tones and third-order distortion products, and it is desirable to reduce IMD products, which adversely impact desired linear behavior of devices (e.g., electrical filters) that incorporate BAW resonators.

In an effort to reduce currents induced by electromagnetic fields in the vicinity of the semiconductor substrates of BAW resonators, and thereby reduce IMD and other sources of distortion, semiconductor substrates used in BAW resonators are often made from undoped, highly resistive material. While some improvements are realized using undoped, highly resistive materials for the substrate, third order IMD products (IMD3) remain problematic especially as higher power transmission and reception, and reduced channel spacing, drives the communications industry.

Packaging for FBAR(s) may include a semiconductor microcap lid placed over the FBAR(s) and the above-noted air cavities formed below the FBAR(s). The microcap lid may be held above the FBAR(s) by posts that are formed from the same material as the microcap lid and that are integral with the microcap lid wafer. The microcap lids are a wafer-level silicon cap (microcap) micromachined from a high resistivity wafer.

Parasitic contributions from the microcap lid wafer/microcap lid degrade linear performance characteristics of the packaged FBAR product. The parasitic contributions arise from the bulk conductivity of the silicon material, as well as surface capacitances and inversions, plus the charging and discharging of semiconductor trap states. Any solution to the parasitic contributions that provides high performance at a lower cost should not interfere with the air cavities below the FBAR, nor adversely affect the frequency centering, Q values, or nonlinearities.

Additionally, gold thermocompression bonds may be used to hold the posts to the substrate that includes the air cavity below the FBAR. The posts are aligned with the gold thermocompression bonds to affix the microcap lid wafer over the FBAR device wafer. The gold thermocompression bond is expensive. At least in part to due to this expense, the size of the area in which the posts are attached to the substrate is limited, and the gold thermocompression bond is used only around a perimeter of the posts. Additionally, the gold thermocompression bond is used at high-pressure/high-temperature which poses a potential obstacle to scaling FBARs to wafers larger than, for example, 200 millimeters. Moreover, the gold thermocompression bonds are IR-based rather than lithography based.

Finally, singulation scribes (air gaps) are present in the silicon microcap in the region between the FBAR base wafer and the silicon microcap, in the scribe regions. In the silicon microcap device, these air gaps require difficult singulation technologies that may often result in perimeter chip-out which must be screened by testing in the final product.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 1 shows a cross-sectional view of a BAW resonator in accordance with a representative embodiment.

FIG. 2A shows a cross-sectional view of a BAW resonator in accordance with a representative embodiment.

FIG. 2C shows a top view of a BAW resonator in accordance with a representative embodiment.

FIG. 5 shows a simplified schematic diagram of an electrical filter in accordance with a representative embodiment.

DETAILED DESCRIPTION

Figure 2B:
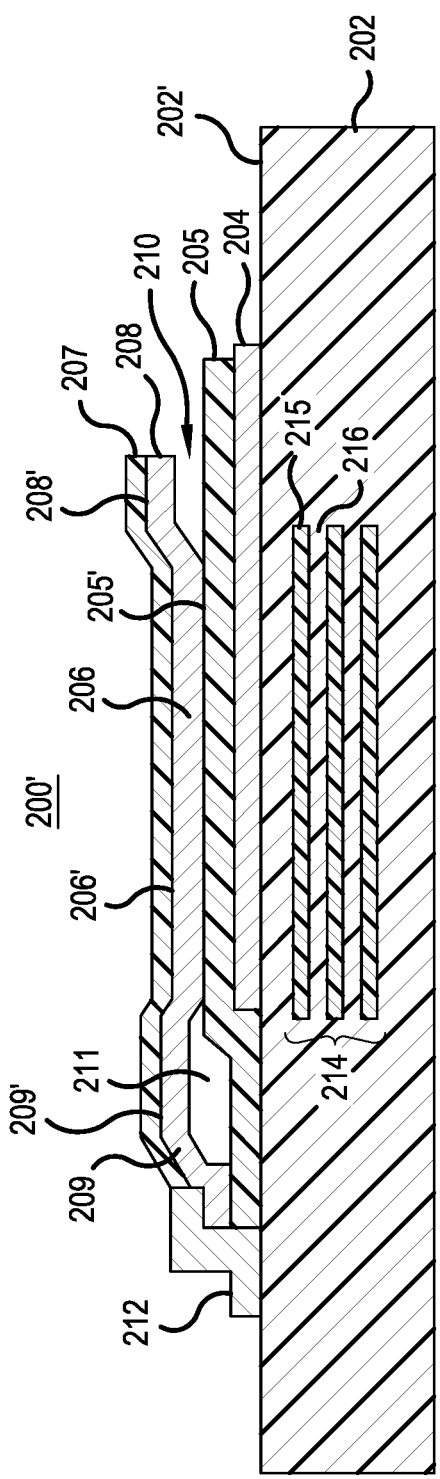
FIG. 2B shows a cross-sectional view of a BAW resonator in accordance with a representative embodiment.

In the following detailed description, for purposes of explanation and not limitation, example embodiments disclosing specific details are set forth in order to provide a thorough understanding of the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

A variety of devices, structures thereof, materials and methods of fabrication are contemplated for the BAW resonators of the apparatuses of the present teachings. Various details of such devices and corresponding methods of fabrication may be found, for example, in one or more of the following U.S. patent publications: U.S. Pat. No. 6,107,721, to Lakin; U.S. Pat. Nos. 5,587,620, 5,873,153, 6,507,983, 7,388,454, 7,714,684, and 8,436,516 to Ruby et al.; U.S. Pat. Nos. 7,369,013, 7,791,434, and 8,230,562 to Fazzio, et al.; U.S. Pat. Nos. 8,188,810, 7,280,007, and 9,455,681 to Feng et al.; U.S. Pat. Nos. 8,248,185, and 8,902,023 to Choy, et al.; U.S. Pat. No. 7,345,410 to Grannen, et al.; U.S. Pat. No. 6,828,713 to Bradley, et al.; U.S. Pat. Nos. 7,561,009, 7,358,831, and 9,243,316 to Larson, III et al.; U.S. Pat. No. 9,197,185 to Zou, et al., U.S. Patent Application Publication No. 20120326807 to Choy, et al.; U.S. Pat. No. 7,629,865 to Ruby; U.S. Patent Application Publication Nos. 20110180391 and 20120177816 to Larson III, et al.; U.S. Patent Application Publication No. 20140132117 to Larson III; U.S. Patent Application Publication No. 20070205850 to Jamneala et al.; U.S. Patent Application Publication No. 20110266925 to Ruby, et al.: U.S. Patent Application Publication No. 20130015747 to Ruby, et al.; U.S. Patent Application Publication No. 20130049545 to Zou, et al.; U.S. Patent Application Publication No. 20140225682 to Burak, et al.; U.S. Patent Application Publication Nos.: 20140118090 and 20140354109 to Grannen, et al.; U.S. Patent Application Publication Nos. 20140292150 and 20140175950 to Zou, et al.; U.S. Patent Application Publication No. 20150244347 to Feng, et al.; U.S. Patent Application Publication 20150311046 to Yeh, et al.; U.S. Patent Application Publication No. 20150207489 to Bi, et al.; and U.S. patent application Ser. No. 15/335,402 to Yeh, et al. filed on Oct. 26, 2016. The entire disclosure of each of the patents, patent application publications, and patent application listed above are hereby specifically incorporated by reference herein. It is emphasized that the components, materials and methods of fabrication described in these patents and patent applications are representative, and other methods of fabrication and materials within the purview of one of ordinary skill in the art are also contemplated.

FIG. 1 is a cross-sectional view of a BAW resonator 100 in accordance with a representative embodiment. The BAW resonator 100 comprises a semiconductor substrate (sometimes referred to as a semiconductor layer) 101, an electrically insulating layer (sometimes referred to as an electrically insulating substrate) 102, and a first electrode 104 disposed over a cavity 103 provided in the electrically insulating layer 102. In accordance with a representative embodiment, the first electrode 104 is in direct contact with an upper surface 102' of the electrically insulating layer 102.

A piezoelectric layer 105 comprises a lower surface in contact with the first electrode 104 and an upper surface 105' in contact with a second electrode 106. As depicted in FIG. 1, the piezoelectric layer 105 extends over an edge of the first electrode 104, and is indirect contact with the upper surface 102' of the electrically insulating layer 102.

An optional passivation layer 107 is provided over the second electrode 106. Illustratively, the passivation layer 107 can be made from various types of materials, including aluminum nitride, silicon carbide, BSG, $SiO_2$, SiN, polysilicon, and the like. The thickness of the passivation layer 107 should generally be sufficient to insulate the layers of BAW resonator 100 from the environment, including protection from moisture, corrosives, contaminants, and debris.

A cantilevered portion 108 of the second electrode 106 is provided on at least one side of the second electrode 106. The cantilevered portion 108 of the second electrode 106 extends over a gap 110a, which illustratively comprises air. The cantilevered portion 108 may also be referred to as a 'wing.' An upper surface 106' of the second electrode 106 is disposed at a first height. The cantilevered portion 108 has an upper surface 108' disposed at a second height, which is higher than the first height. Thus, the upper surface 108' is raised up relative to the upper surface 106'.

The BAW resonator 100 comprises a bridge 109 along the side of the BAW resonator 100 comprising an electrical interconnection 112. The bridge 109 provides a gap 110b, which may be a void (e.g., air) or may be filled with a low acoustic impedance material. The bridge 109 is described more fully in U.S. Pat. No. 8,248,185, and as such many of the details of the bridge 109 are not repeated in the present application to avoid obscuring the description of the representative embodiments of the BAW resonator 100. As noted above, the cantilevered portion 108 can be disposed on more than one of the sides of the second electrode 106. However, the cantilevered portion 108 cannot be disposed on the same side of the second electrode 106 as the bridge 109.

As depicted in FIG. 1, the bridge 109 has an upper surface 109'. The upper surface 109' is disposed substantially at a third height (z-dimension in the coordinate system depicted). The third height is higher than the first height. Thus, the upper surface 109' is raised up relative to the upper surface 106'.

The BAW resonator 100 may also comprise one or more frame elements, which are not depicted. These frame elements, such as so-called "innies" or recesses, "outies" and "collars," as well as other known components useful in confining energy and improving the quality factor (Q), maximizing the resistance at parallel resonance ($R_p$), and minimizing the resistance at series resonance ($R_s$), are contemplated. Many of these components are described in detail in the above-incorporated patent literature, and are not repeated to avoid obscuring the description of the present teachings.

The semiconductor substrate 101 comprises an undoped and comparatively high resistivity semiconductor material, such as undoped silicon (Si), an undoped III-V material (e.g., GaAs or InP compounds), or undoped silicon-germanium (SiGe). It is emphasized that undoped highly resistive materials for use as the substrate is merely illustrative. Specifically, because of the electrical isolation provided by the electrically insulating layer 102, the semiconductor material selected for the semiconductor substrate 101 does not have to be undoped or comparatively high resistivity semiconductor material. In fact, in other representative embodiments, the semiconductor substrate 101 can be replaced with another material, which is not a semiconductor, but has suitable electrical characteristics and mechanical strength. By way of example, a layer of suitable glass, mica, alumina non-piezoelectric aluminum nitride, or suitable ceramic materials could be used for the layer on which the electrically insulating layer 102 is disposed.

The semiconductor substrate 101 comprises an upper surface 101' with an outer perimeter. As shown in FIG. 1, the electrically insulating layer 102 is disposed on the upper surface 101' of the semiconductor substrate 101, and covers entirely the outer perimeter thereof. As such, the semiconductor substrate 101 comprises a substrate outer perimeter and the electrically insulating layer 102 has a layer outer perimeter, with the semiconductor substrate outer perimeter and the layer outer perimeter being aligned.

As depicted in FIG. 1, the second electrode 106 comprises an upper surface 106'. As can be seen, the upper surface 106' is disposed substantially at a first height (z-dimension in the coordinate system depicted). Similarly, the cantilevered portion 108 comprises an upper surface 108'. The upper surface 108' is disposed substantially at a second height (again, z-dimension in the coordinate system depicted). The second height is higher than the first height. Thus, the upper surface 106' of the cantilevered portion is raised up relative to the upper surface 106'.

As depicted in FIG. 1, the cavity 103 has an edge 113, and the bridge 109 extends past the edge 113 of the cavity 103 (or similar reflective element, such as a mismatched Bragg reflector described below), and over the semiconductor substrate 101. As such, in a representative embodiment, the bridge 109 is disposed partially over the cavity 103, extends over the edge 113 of the cavity 103, and is disposed partially over the semiconductor substrate 101.

The combination of the first electrode 104, the piezoelectric layer 105, and the second electrode 106 is often referred to as the "acoustic stack" of the BAW resonator 100. The region of contacting overlap of the first and second electrodes 104, 106, the piezoelectric layer 105 and the cavity 103, or other reflector (e.g., Bragg reflector (see FIG. 1C)) is referred to as an active area of the BAW resonator 100. By contrast, an inactive area of the BAW resonator 100 comprises a region of overlap between first electrode 104 or second electrode 106, or both, and the piezoelectric layer 105 not disposed over the cavity 103, or other suspension structure, or acoustic mirror. As described more fully in U.S. Pat. No. 8,248,185, it is beneficial to the performance of the BAW resonator 100 to reduce the area of the inactive region of the BAW resonator 100 to the extent practical.

The electrically insulating layer 102 illustratively comprises a suitable material and is of a sufficient thickness (z-dimension of the coordinate system of FIG. 1) to effectively electrically isolate the acoustic stack from currents generated in the semiconductor substrate 101. To this end, as noted above, the environment in which the BAW resonator 100 is disposed often has a significant amount of electromagnetic fields, for example in the radio frequency (RF) and microwave spectra. These electromagnetic fields can induce currents via the carriers of the semiconductor substrate 101.

In known devices, these induced currents can contribute to intermodulation distortion (IMD) products. IMD products are typically presented by the power (usually in dBm) of mixed products from two signals having different frequencies. These IMDs may be second order products (IMD2), third order products (IMD3), etc. The strength (power) of IMD products is dependent on device linearity (including the linear response of the substrate material) and two mixing signal powers. Typical non-linear materials are semiconductors, and linear materials are metal conductors (without junctions) and insulators. In accordance with certain representative embodiments, applying an electrically insulating material over a semiconductor substrate separates the non-linear semiconductor substrate and thereby reduces IMD products. In other representative embodiments described below, only an electrically insulating substrate is provided, thereby eliminating the source of IMD products (e.g., IMD3 products).

Another way to appreciate this is from the electric lump circuit for a BAW resonator (e.g., an FBAR). In accordance with a representative embodiment, the acoustic stack is separated from the nonlinear (semiconductor) substrate by a capacitor with impedance of Z, which is $1/(2*\pi*C*f)$, where C is the capacitance, and f is the frequency. Notably, $C=A*\varepsilon_o*\varepsilon_r/t$, where A is area, t is thickness, and $\varepsilon_o$ and $\varepsilon_r$ are absolute and relative permittivity, respectively. As can be readily appreciated, the lower the relative permittivity ($\varepsilon_r$) of the electrically insulating layer 102 is, the higher Z is, and the better the electrical isolation of the acoustic stack is. Similarly, the greater the thickness of the electrically insulating layer 102, the higher Z is. In accordance with certain representative embodiments, by selecting a material having a comparatively low dielectric constant (or comparatively low relative permittivity ($\varepsilon_r$)) for the electrically insulating layer 102, and selecting a sufficient thickness, electrically insulating layer 102 acts like an electrical open between the semiconductor substrate 101 and the acoustic stack, thereby providing suitable electrical isolation of the acoustic stack from the semiconductor substrate 101, and other sources of undesired induced currents. Stated somewhat differently, the combination of the thickness of the electrically insulating layer and the relative permittivity ($\varepsilon_r$) reduces electromagnetic coupling between the semiconductor substrate and the acoustic stack of the BAW resonator 100. While not wishing to be bound by theory, Applicants surmise that a capacitance formed between the acoustic stack and the semiconductor substrate 101 is reduced by increasing the thickness (z-direction in the coordinate system of FIG. 1), or selecting a material for the electrically insulating layer 102 having a comparatively low relative permittivity ($\varepsilon_r$) of the electrically insulating layer 102, or both. This reduced capacitance provides, in essence, an electrical open between the semiconductor substrate 101 and the acoustic stack. Ultimately, this improved electrical isolation is manifest in reduced power of IMDs (e.g., IMD3's), and an overall improvement in the linearity of the BAW resonator 100, and electrical components (e.g., electrical filters) that incorporate the BAW resonator 100.

Generally, the electrically insulating layer 102 has an electrical resistivity between approximately $1\times10^6$ Ω-m and approximately $5\times10^{16}$ Ω-m. In some representative embodiments, it is beneficial to select a material for the electrically insulating layer 102 that has a resistivity of at least $1\times10^{12}$. In other representative embodiments, it is beneficial to select a material for the electrically insulating layer 102 that has a resistivity that is greater than $10^3$ times that of the semiconductor substrate 101, which is, for example silicon.

Additionally, the electrically insulating layer 102 has a comparatively low relative permittivity ($\varepsilon_r$), which is illustratively in the range of approximately 2.0 to approximately 10.0. Notably, for optimization in some representative embodiments, it may be useful to select a material for electrically insulating layer 102 that has a permittivity in the low end of the noted range of permittivity to provide suitable capacitive decoupling from the semiconductor substrate 101. In some representative embodiments, it is beneficial to select a material for the electrically insulating layer 102 having a relative permittivity ($\varepsilon_r$) that is two (2) to three (3) times less than that of the semiconductor substrate 101, which is, for example silicon. Notably, certain low-k materials, which are generally not mechanically rigid, are viable options since they are made relatively thick, and are disposed over the semiconductor substrate 101 (or other substrate with suitable mechanical strength) and under the components of the BAW resonator 100 disposed thereover.

By way of example, the electrically insulating layer 102 may comprise one or more layers of silicon dioxide ($SiO_2$), engineered silicon carbide (having a resistivity of at least $10^6$ Ω-m), silicon nitride ($Si_3N_4$), benzocylcobutene (BCB), polyimide, sapphire, or non-piezoelectric ('glassy') aluminum nitride (AlN), which also provides comparatively good heat dissipation. Specifically, and as described more fully below, the electrically insulating layer 102 may comprise a plurality of layers, which may be comprised of the same or different materials.

The thickness of the electrically insulating layer 102 depends on the electrical resistivity of the material selected. Generally, selection of any of the illustrative materials above requires a thickness (z-dimension) on the order of $10^1$ µm. Notably, magnitude of IMD3 products decreases with increasing thickness of the electrically insulating layer 102 until a relative minimum IMD3 product magnitude is reached, at which point further increase of the thickness of the insulating layer provides no further improvement of IMD3 products. Just by way of example, a layer of $SiO_2$, when used for the electrically insulating layer 102 has a thickness in the range of approximately 1 µm to approximately 100 µm, or more. Again, the thickness selected for the electrically insulating layer 102 depends on its dielectric properties, and thus its ability to electrically isolate the acoustic stack from currents generated in the semiconductor substrate 101. As such, materials having an electrical resistivity greater than $SiO_2$ and a dielectric constant less than $SiO_2$, may not need as great a thickness as $SiO_2$, whereas materials having an electrical resistivity less than $SiO_2$ and a dielectric constant greater than $SiO_2$ would have a greater thickness.

The piezoelectric layer 105 generally comprises a highly textured piezoelectric material, such as aluminum nitride (AlN), and may be fabricated according to the teachings of patent literature incorporated above. In certain representative embodiments, the piezoelectric layer 105 may be doped with rare-earth elements to improve the acoustic coupling coefficient ($kt^2$) of the piezoelectric layer. The rare earth elements include yttrium (Y), lanthanum (La), cerium (Ce), praseodymium (Pr), neodymium (Nd), promethium (Pm), samarium(Sm), europium (Eu), gadolinium (Gd), terbium (Tb), dysprosium (Dy), holmium (Ho), erbium (Er), thulium (Tm), ytterbium (Yb) and lutetium (Lu), as known by one of ordinary skill in the art. The various embodiments contemplate incorporation of any one or more rare earth elements, although specific examples are discussed herein.

In representative embodiments in which the doped piezoelectric material is AlXN (where X is the rare-earth element), the doping elements replace only Al atoms in the AlN crystal. Accordingly, the percentage of nitrogen atoms in the piezoelectric material remains substantially the same regardless of the amount of doping. Notably, when the percentages of doping elements (e.g., Sc) in a doped AlN layer are discussed herein, it is in reference to the total atoms (including nitrogen) of the AlN piezoelectric layer. So, for example, and as described for example in U.S. Patent Application Publication No. 20140132117, if the Sc in the piezoelectric layer of a representative embodiment has an atomic percentage of approximately 5.0%, and the Al has an atomic percentage of approximately 95.0%, then the atomic consistency of the piezoelectric layer may then be represented as Al0.95Sc0.05 N.

In certain representative embodiments, the piezoelectric layer 105 comprises aluminum nitride (AlN) that is doped with scandium (Sc). The atomic percentage of scandium in an aluminum nitride layer is approximately greater than 9.0% to approximately 44.0%; and in other representative embodiments, the percentage of scandium in an aluminum nitride layer is approximately greater than 5.0% to approximately 44.0%.

The first and second electrodes 104, 106 and the electrical interconnection 112 are made of materials that survive the fabrication sequences described below in connection with FIGS. 2A-2F. As will become clearer as the present description continues, in certain representative embodiments, the first and second electrodes 104, 106 may not comprise tungsten (W) or molybdenum (Mo), or a combination (e.g., ally or stack) of Mo and W. Rather, first and second electrodes 104, 106 are made from one or more of ruthenium, platinum, iridium, aluminum, chromium, or other suitable materials that can survive the processing materials used to fabricate the BAW resonator 100.

FIG. 2A is a cross-sectional view a BAW resonator 200 in accordance with a representative embodiment. Many aspects and details (e.g., materials, material characteristics and dimensions) of BAW resonator 200 are common to certain aspects and details of BAW resonator 100 described in connection with FIG. 1. These common aspects and details may not be repeated to avoid obscuring the presently described representative embodiments.

The BAW resonator 200 comprises an electrically insulating substrate 202, and a first electrode 204 disposed over a cavity 203 provided in the electrically insulating substrate 202. In accordance with a representative embodiment, the first electrode 204 is in direct contact with an upper surface 202' of the electrically insulating substrate 202. Significantly, unlike BAW resonator 100, BAW resonator 200 does not comprise a semiconductor substrate, or semiconductor layer beneath the electrically insulating substrate 202.

A piezoelectric layer 205 is disposed over the first electrode 204 and comprises a lower surface in contact with the first electrode 204 and an upper surface 205' in contact with a second electrode 206. As depicted in FIG. 2A, the piezoelectric layer 205 extends over an edge of the first electrode 204, and is in direct contact with the upper surface 202' of the electrically insulating substrate 202.

An optional passivation layer 207 is provided over the second electrode 206. Illustratively, the passivation layer 207 can be made from various types of materials, including aluminum nitride, silicon carbide, BSG, $SiO_2$, SiN, polysilicon, and the like. The thickness of the passivation layer 207 should generally be sufficient to insulate the layers of BAW resonator 200 from the environment, including protection from moisture, corrosives, contaminants, and debris.

The cantilevered portion 208 of the second electrode 206 is provided on at least one side of the second electrode 206, and has an upper surface 208'. The cantilevered portion 208 of the second electrode 206 extends over a gap 210, which illustratively comprises air. The cantilevered portion 208 may also be referred to as a 'wing.'

The BAW resonator 200 may also comprise one or more frame elements, which are not depicted. These frame elements, such as so-called "innies" or recesses, "outies" and "collars," as well as other known components useful in confining energy and improving the quality factor (Q), maximizing the resistance at parallel resonance ($R_p$), and minimizing the resistance at series resonance ($R_s$), are contemplated. Many of these components are described in detail in the above-incorporated patent literature, and are not repeated to avoid obscuring the description of the present teachings.

As depicted in FIG. 2A, the second electrode 206 comprises an upper surface 206'. As can be seen, the upper surface 206' is disposed substantially at a first height (z-dimension in the coordinate system depicted). Similarly, a cantilevered portion 208 comprises an upper surface 208'. The upper surface 208' is disposed substantially at a second height (again, z-dimension in the coordinate system depicted). The second height is higher than the first height. Thus, the upper surface 206' of the cantilevered portion 208 is raised up relative to the upper surface 206'.

As also depicted in FIG. 2A, the bridge 209 has upper surface 209'. The upper surface 209' is disposed substantially at a third height (again, z-dimension in the coordinate system depicted). The third height is higher than the first height. Thus, the upper surface 209' is raised up relative to the upper surface 206'.

The BAW resonator 200 comprises a bridge 209 along the side that comprises an interconnection 212. The bridge 209 provides a gap 210, which may be a void (e.g., air) or may be filled with a low acoustic impedance material. The bridge 209 is described more fully in U.S. Pat. No. 8,248,185, and as such many of the details of the bridge 209 are not repeated in the present application to avoid obscuring the description of the representative embodiments of the BAW resonator 200. As noted above, the cantilevered portion 208 can be disposed on more than one of the sides of the second electrode 206. However, the cantilevered portion 208 cannot be disposed on the same side of the second electrode 206 as the bridge 209.

As depicted in FIG. 2A, the cavity 203 has edge 213, and the bridge 209 extends past the edge 213 of the cavity 203 (or similar reflective element, such as a mismatched Bragg reflector described below), and over the electrically insulating substrate 202. As such, in a representative embodiment, the bridge 209 is disposed partially over the cavity 203, extends over the edge 213 of the cavity 203, and is disposed partially over the electrically insulating substrate 202.

The combination of the first electrode 204, the piezoelectric layer 205, and the second electrode 206 is often referred to as the "acoustic stack" of the BAW resonator 200. The region of contacting overlap of the first and second electrodes 204, 206, the piezoelectric layer 205 and the cavity 203, or other reflector (e.g., Bragg reflector (see FIG. 2B)) is referred to as an active area of the BAW resonator 200. By contrast, an inactive area of the BAW resonator 200 comprises a region of overlap between first electrode 204 or second electrode 206, or both, and the piezoelectric layer 205 not disposed over the cavity 203, or other suspension structure, or acoustic mirror. As described more fully in U.S. Pat. No. 8,248,185, it is beneficial to the performance of the BAW resonator 200 to reduce the area of the inactive region of the BAW resonator 200 to the extent practical.

The electrically insulating substrate 202 illustratively comprises a suitable material of a sufficient thickness (z-dimension of the coordinate system of FIG. 2A) to effectively electrically isolate the acoustic stack. As can be appreciated, by eliminating the semiconductor substrate (e.g., semiconductor substrate 101 of the representative embodiments of FIG. 1), this source of induced currents that can contribute to IMDs (e.g., IMDIII's) is eliminated. Moreover, because the electrically insulating substrate 202 has such a low carrier concentration, no currents are induced therein. As such, electromagnetic radiation prevalent in the environment of BAW resonator 200 cannot induce current in the electrically insulating substrate 202, thereby avoiding a significant source of IMDs in known BAW resonators and electrical components comprising BAW resonators. Stated somewhat differently, as described above, the electrically insulating layer 102 of the representative embodiments of FIG. 1 provides electrical isolation from the semiconductor substrate 101. By contrast, by providing the electrically insulating substrate 202 of the representative embodiments of FIG. 2A, one source of IMDs (i.e., the semiconductor substrate 101 from FIG. 1) is eliminated.

Generally, the electrically insulating substrate 202 has an electrical resistivity between approximately $1\times10^6$ Ω-m and approximately $5\times10^{16}$ Ω-m. In some representative embodiments, it is beneficial to select a material for the electrically insulating layer 102 that has a resistivity of at least $1\times10^{12}$. By way of example, the electrically insulating substrate 202 may comprise one or more layers of silicon dioxide ($SiO_2$), silicon nitride ($Si_3N_4$), engineered silicon carbide (having a resistivity of at least $10^6$ Ω-m), benzocyclobutene (BCB), polyimide, sapphire, or non-piezoelectric ('glassy') aluminum nitride (AlN), which also provides comparatively good heat dissipation. Specifically, and as described more fully below, the electrically insulating substrate 202 may comprise multiple layers, which may be of the same or different materials.

Additionally, the electrically insulating layer 202 has a comparatively low relative permittivity ($\varepsilon_r$), which is illustratively in the range of approximately 2.0 to approximately 10.0. Notably, for optimization in some representative embodiments, it may be useful to select a material for electrically insulating layer 202 that has a permittivity in the low end of the noted range of permittivity.

Unlike electrically insulating layer 102, because there is no semiconductor substrate beneath the electrically insulating substrate 202 that must be electrically isolated from the acoustic stack, the thickness of the electrically insulating substrate 202 is not necessarily selected to ensure this electrical isolation, but rather to provide sufficient mechanical strength for wafer handling during wafer processing. Generally, selection of any of the illustrative materials above requires a thickness (z-dimension) on the order of $10^1$ μm. Just by way of example, a layer of $SiO_2$, when used for the electrically insulating substrate 202 has a thickness in the range of approximately 1 μm to approximately 100 μm, or more.

The piezoelectric layer 205 generally comprises a highly textured piezoelectric material, such as aluminum nitride (AlN), and may be fabricated according to the teachings of patent literature incorporated above. In certain representative embodiments, the piezoelectric layer 205 may be doped with rare-earth elements to improve the acoustic coupling coefficient ($kt^2$). The rare earth elements include yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu), as known by one of ordinary skill in the art. The various embodiments contemplate incorporation of any one or more rare earth elements, although specific examples are discussed herein.

In representative embodiments in which the doped piezoelectric material is AlXN (where X is the rare-earth element), the doping elements replace only Al atoms in the AlN crystal. Accordingly, the percentage of nitrogen atoms in the piezoelectric material remains substantially the same regardless of the amount of doping. Notably, when the percentages of doping elements (e.g., Sc) in a doped AlN layer are discussed herein, it is in reference to the total atoms (including nitrogen) of the AlN piezoelectric layer. So, for example, and as described for example in U.S. Patent Application Publication No. 20140132117, if the Sc in the piezoelectric layer of a representative embodiment has an atomic percentage of approximately 5.0%, and the Al has an atomic percentage of approximately 95.0%, then the atomic consistency of the piezoelectric layer may then be represented as $Al_{0.95}Sc_{0.05}$ N.

In certain representative embodiments, the piezoelectric layer 205 comprises aluminum nitride (AlN) that is doped with scandium (Sc). The atomic percentage of scandium in an aluminum nitride layer is approximately greater than 9.0% to approximately 44.0%; and in other representative embodiments, the percentage of scandium in an aluminum nitride layer is approximately greater than 5.0% to approximately 44.0%.

The first and second electrodes 204, 206 and the interconnection 212 are made of materials that can survive the fabrication sequences described below in connection with FIGS. 2A-2F. As will become clearer as the present description continues, in certain representative embodiments, the first and second electrodes 204, 206 may not comprise tungsten (W) or molybdenum. Rather, first and second electrodes 204, 206 are made from one or more of ruthenium, platinum, iridium, aluminum, chromium, or other suitable materials that can survive the processing materials used to fabricate the BAW resonator 200.

FIG. 2B is a cross-sectional view a BAW resonator 200' in accordance with a representative embodiment. Many aspects and details (e.g., materials, material characteristics and dimensions) of BAW resonator 200' are common to certain aspects and details of BAW resonator 100 and BAW resonator 200 described in connection with FIGS. 1 and 2A. These common aspects and details may not be repeated to avoid obscuring the presently described representative embodiments.

Notably, the BAW resonator 200' is substantively identical to BAW resonator 200, with the exception of the acoustic reflector disposed in the electrically insulating substrate. To this end, rather than cavity 203, the BAW resonator 200' comprises an acoustic Bragg reflector 214 comprising alternating low acoustic impedance layers 216 and high acoustic impedance layers 215. Preferably, the low acoustic impedance layers 216 and high acoustic impedance layers 215 are selected to provide a comparatively high ratio of acoustic impedance. By way of illustration, the low acoustic impedance layers 216 comprise a dielectric material such as silicon dioxide (e.g., the same material as the electrically insulating substrate 202). While the high acoustic impedance layers 215 may be tungsten or iridium, it is preferable that the high acoustic impedance layers 216 comprise a high acoustic impedance dielectric material, so there is no electrical coupling between the acoustic stack of BAW resonator 200' and high acoustic impedance layers 215 underneath. The process for fabricating the acoustic Bragg reflector 214 is described below.

FIG. 2C shows a top view of BAW resonator 200' taken along 2B-2B. Notably, the passivation layer 207 is not shown in FIG. 2C so details are not obscured.

The BAW resonator 200' comprises second electrode 206, comprising cantilevered portions 208 along first through fourth sides 221, 222, 223 and 224. The interconnection 212 is connected to a fifth side 225, which is also the side where the bridge 209 is located. Notably, the cantilevered portions 208 can be disposed on at least one of the first~fourth sides 221~224, but not along the fifth side 225, where the interconnection 212 makes an electrical connection with the BAW resonator 200'.

FIGS. 3A-3F show cross-sectional views of a process of fabricating a BAW resonator 300 in accordance with a representative embodiment. Many aspects and details (e.g., materials, material characteristics and dimensions) of BAW resonator 300 are common to certain aspects and details of BAW resonators 100, 200, and 200' described in connection with FIGS. 1-2B. These common aspects and details may not be repeated to avoid obscuring the presently described representative embodiments.

Figure 3A:
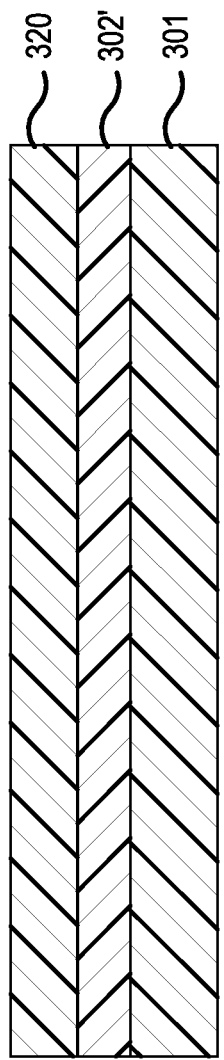
FIGS. 3A-3F show cross-sectional views of a process of fabricating a BAW resonator in accordance with a representative embodiment.
Figure 3B:
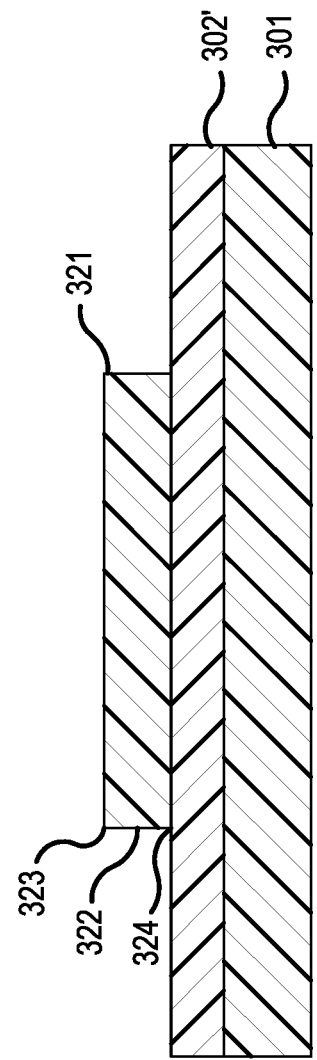

Turning to FIG. 3A, an electrically insulating layer 302' is disposed between a semiconductor substrate 301 and a sacrificial layer 320. As will be appreciated as the present description continues, the fabrication sequence of FIGS. 3A-3F results in a BAW resonator substantively identical to BAW resonator 100, and thus includes the semiconductor substrate 301. However, the fabrication sequence of FIGS. 3A-3F may be slightly modified to realize a BAW resonator comprising an electrically insulating substrate (e.g., electrically insulating substrate 202), and no semiconductor substrate. Essentially, the step of providing the semiconductor substrate 301 is foregone, and providing the electrically insulating layer 302' begins the fabrication sequence.

The semiconductor substrate 301 is illustratively an undoped and comparatively high resistivity semiconductor material, such as undoped silicon (Si), an undoped III-V material (e.g., GaAs or InP compounds), or undoped silicon-germanium (SiGe). As will be appreciated, the relatively low carrier concentration in the selected semiconductor substrate 301 reduces the magnitude of currents induced therein, and eases the electrical insulation and isolation requirements of the electrically insulating layer 302'.

However, because of the electrical isolation provided by the electrically insulating layer 302', the semiconductor material selected for the semiconductor substrate 301 does not have to be undoped or comparatively high resistivity semiconductor material. In fact, in other representative embodiments, the semiconductor substrate 301 can be replaced with another material, which is not a semiconductor, but has suitable electrical characteristics and mechanical strength. By way of example, as noted above, a layer of suitable glass, ceramic, or polymer, could be used for the layer on which the electrically insulating layer 302' is disposed.

As noted above, IMD3 product magnitude decreases with increasing thickness of the electrically insulating layer 302' until a relative minimum IMD3 product magnitude is reached, at which point further increase of the thickness of the insulating layer provides no further improvement of IMD3 products. Just by way of example, a layer of $SiO_2$, when used for the electrically insulating layer 302' has a thickness in the range of approximately 1 μm to approximately 100 μm, or more. Again, the thickness selected for the electrically insulating layer 302' depends on its dielectric properties, and thus its ability to electrically isolate the acoustic stack from currents generated in the semiconductor substrate 301. As such, materials having an electrical resistivity greater than $SiO_2$ and a dielectric constant less than $SiO_2$ may not need as great a thickness as $SiO_2$, whereas materials having an electrical resistivity less than $SiO_2$ and dielectric constant greater than $SiO_2$ would have a greater thickness.

The electrically insulating layer 302' illustratively has an electrical resistivity between approximately $1 \times 10^6$ Ω-m and approximately $5 \times 10^{16}$ Ω-m. In some representative embodiments, it is beneficial to select a material for the electrically insulating layer 302' that has a resistivity of at least $1 \times 10^{12}$. In other representative embodiments, it is beneficial to select a material for the electrically insulating layer 302' that has a resistivity that is greater than $10^3$ times that of the semiconductor substrate 301, which is, for example silicon.

Additionally, the electrically insulating layer 302' has a comparatively relative permittivity ($\varepsilon_r$), which is illustratively in the range of approximately 2.0 to approximately 10.0. Notably, for optimization in some representative embodiments, it may be useful to select a material for electrically insulating layer 302' that has a permittivity in the low end of the noted range of permittivity to shield the semiconductor substrate 301. In some representative embodiments, it is beneficial to select a material for the electrically insulating layer 302' having a relative permittivity ($\varepsilon_r$) that is two (2) to three (3) times less than that of the semiconductor substrate 101, which is, for example silicon. Notably, certain low-k materials, which are generally not mechanically rigid, are viable options since they are made relatively thick, and are disposed over the semiconductor substrate 301 (or other substrate with suitable mechanical strength) and under the components of the BAW resonator 100 disposed thereover. By way of example, the electrically insulating layer 302' may comprise one or more layers of silicon dioxide ($SiO_2$), silicon nitride ($Si_3N_4$), engineered silicon carbide (having a resistivity of at least $10^6$ Ω-m), benzocylcobutene (BCB), polyimide, or non-piezoelectric ('glassy') aluminum nitride (AlN), which also provides comparatively good heat dissipation. Specifically, and as described more fully in connection with FIG. 3C, the electrically insulating layer 302' may comprise multiple layers, which may be of the same or different materials. The electrically insulating layer 302' is deposited on the semiconductor substrate 301 using a known method commensurate with the selected material. Such methods include, but are not limited to, chemical vapor deposition (CVD) or plasma enhanced CVD (PECVD), or physical vapor deposition (PVD). By way of example, in a representative embodiment, the electrically insulating layer 302' is $SiO_2$ fabricated by PECVD using tetraethoxysilane (TEOS).

The sacrificial layer 320 is selected to be removed using a process that does not detrimentally remove other materials of the resultant BAW resonator, for example the electrically insulating layer 302'. In accordance with a representative embodiment, illustrative candidates for the sacrificial layer 320 include, but are not limited to amorphous or polycrystalline silicon, molybdenum (Mo), tungsten (W), germanium (Ge), SiGe, and titanium tungsten (TiW).

The sacrificial layer 320 is also deposited using a known method commensurate with the material selected for the sacrificial layer 320. For example, if the sacrificial layer 320 comprises silicon, the sacrificial layer 320 can be deposited using a known physical vapor deposition (PVD), chemical vapor deposition (CVD), or plasma enhanced chemical vapor deposition (PECVD) method. As will be appreciated, the sacrificial layer 320 is deposited at a thickness (z-direction of the coordinate system of FIG. 3A) great enough to provide adequate depth of the cavity 303 from which it is formed. By way of example, the sacrificial layer 320 is deposited to a thickness in the range of approximately 500 Å to approximately 10 µm. After fabrication of the sacrificial layer 320, a known masking and etching step is used to form a sacrificial island 321 depicted in FIG. 3B. By way of illustration, a suitable mask can be provided over the sacrificial layer 320, and a plasma etching process can be carried out. Such a dry etching method may be a deep reactive ion etching (DRIE) process, such as the known Bosch Method, which provides comparatively deep etches and comparatively high aspect-ratio etches. Alternatively, a wet etch (e.g., HF-nitric solution, or potassium hydroxide (KOH)) can be carried out to realize the sacrificial island 321.

Notably, the sacrificial island 321 has comparatively vertical sides 322, and sharp corners 323, 324. This is not essential, and, based on the etching method, the width (x-direction of the coordinate system of FIG. 3B) may decrease between the corners 323, 324, resulting in sides 322 being oriented at an angle. As will be appreciated as the present description continues, the dimensions and shape of the sacrificial island 321 dictate the shape of the resultant cavity.

Figure 3C:
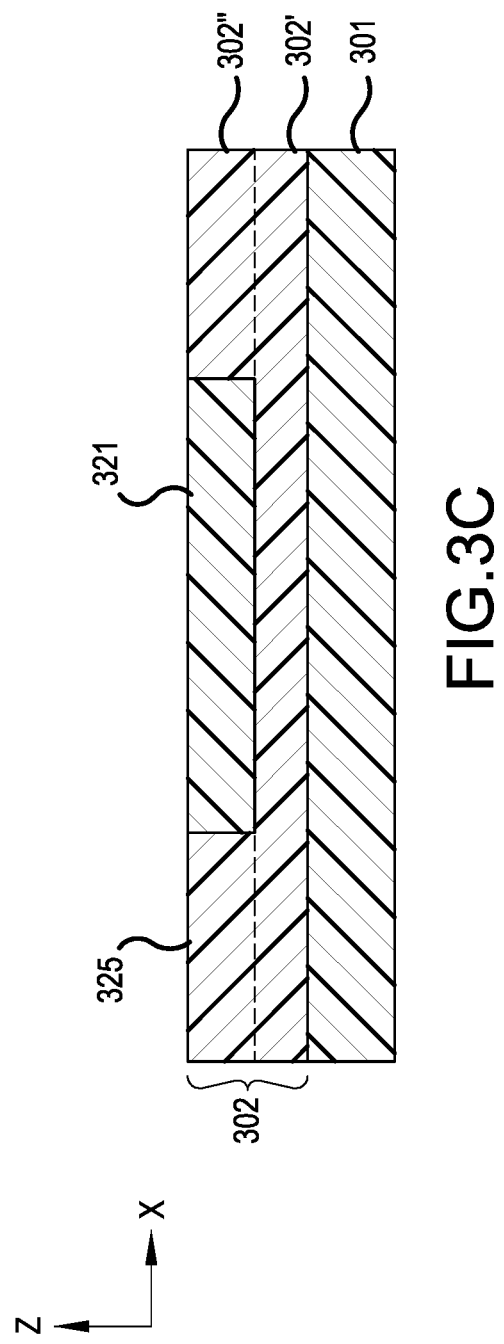

Turning to FIG. 3C, another electrically insulating layer 302" is formed over the electrically insulating layer 302' to provide the electrically insulating substrate 302. In accordance with a representative embodiment, the electrically insulating layers 302', 302" are made of the same material and using the same methods. So, for example, the electrically insulating layers 302', 302" comprise $SiO_2$ fabricated using a TEOS precursor. Alternatively, the electrically insulating layers 302', 302" are fabricated from different materials. For example, electrically insulating layer 302' may comprise $SiO_2$, and the electrically insulating layer 302" may be $Si_3N_4$. Providing different materials for the electrically insulating layers 302', 302" may improve the ability to planarize the upper surface of the electrically insulating substrate 302. Notably, the electrically insulating layer 302" may comprise multiple layers of the same or of different materials.

Like electrically insulating layer 302', electrically insulating layer 302" illustratively has an electrical resistivity between approximately $1 \times 10^6$ Ω-m and approximately $5 \times 10^{16}$ Ω-m. In some representative embodiments, it is beneficial to select a material for the electrically insulating layer 302" that has a resistivity of at least $1 \times 10^{12}$. In other representative embodiments, it is beneficial to select a material for the electrically insulating layer 302" that has a resistivity that is greater than $10^3$ times that of the semiconductor substrate 301, which is, for example silicon. Additionally, the electrically insulating layer 302" has a comparatively relative permittivity ($\varepsilon_r$), which is illustratively in the range of approximately 2.0 to approximately 10.0. Notably, for optimization in some representative embodiments, it may be useful to select a material for electrically insulating layer 302" that has a permittivity in the low end of the noted range of permittivity to provide capacitive decoupling from the semiconductor substrate 301. In some representative embodiments, it is beneficial to select a material for the electrically insulating layer 302' having a relative permittivity ($\varepsilon_r$) that is two (2) to three (3) times less than that of the semiconductor substrate 101, which is, for example silicon.

By way of example, the electrically insulating layer 302" may comprise one or more layers of silicon dioxide ($SiO_2$), engineered silicon carbide (having a resistivity of at least $10^6$ Ω-m), silicon nitride ($Si_3N_4$), benzocylcobutene (BCB), polyimide, sapphire, or non-piezoelectric ('glassy') aluminum nitride (AlN), which also provides comparatively good heat dissipation.

After fabrication of the electrically insulating layer 302", an upper surface 325 is chemically-mechanically polished to provide a suitable surface over which to form the acoustic stack and other elements of a BAW resonator.

Figure 3D:
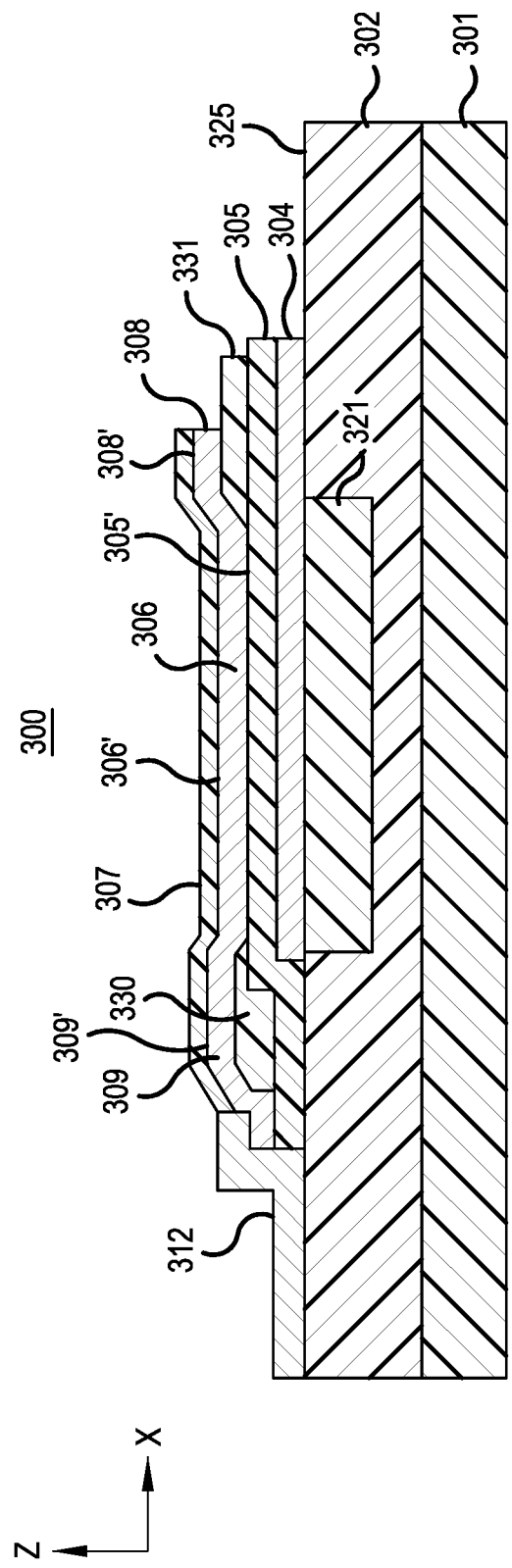

Turning to FIG. 3D, the next steps of fabrication are depicted. A first electrode 304 is deposited using a known method directly on the upper surface 325 and thereby directly on an upper surface 325 of the electrically insulating layer 302", and directly on an upper surface 325 of the sacrificial island 321. In the presently described representative embodiment, the first electrode 304 comprises a material that will not be substantially eroded or substantially damaged when sacrificial material is removed. As such, in the presently described embodiment, the first electrode 304 does not comprise tungsten or molybdenum.

Next, a piezoelectric layer 305 is deposited over the first electrode 304. The piezoelectric layer 305 is illustratively AlN, and may be doped with a rare-earth element (e.g., Sc) as described above. The piezoelectric layer 305 comprises a lower surface in contact with the first electrode 304.

After formation of the piezoelectric layer 305, a photoresist (not shown) is patterned, and a first sacrificial layer 330 and a second sacrificial layer 331 are deposited for eventual formation of a bridge 309 and a cantilevered portion 308. The first and second sacrificial layers 330, 331 comprise the same material as the sacrificial island 321. Notably, the first and second sacrificial layers 330, 331 are formed from the same film deposition or "layer", and are formed to provide the desired shape and dimensions of the bridge 309 and the cantilevered portion 308. As such, known etching methods such as plasma etching or wet etching may be used to form the tapered sides as desired.

Next, a second electrode 306 is deposited over the underlying structure, and a passivation layer 307 is optionally provided over the second electrode 306.

In accordance with a representative embodiment, in which silicon is used for the sacrificial island 321, the first sacrificial layer 330 and the second sacrificial layer 331 are removed using a gaseous or "dry" etch sequence using xenon difluoride ($XeF_2$) to remove the sacrificial material. Notably, other materials selected to have a comparatively high etch rate in $XeF_2$ may be used for the sacrificial island 321, the first sacrificial layer 330, and the second sacrificial layer 331.

Notably, before the etching sequence is undertaken, a comparatively thin (e.g., 50 Å to 300 Å) layer (not shown) of AlN, silicon carbide (SiC), or suitable polymer may be deposited using a known method over the second electrode 306, frame elements (not shown), etc. This etch stop layer is beneficial to protect elements (e.g., frame elements) made of molybdenum, tungsten and other materials desired to survive the etch release step using $XeF_2$.

In accordance with a representative embodiment, the underside of the semiconductor substrate 301 sits on a wafer chuck, and a metallic ring wafer clamp is applied around the perimeter of the wafer, allowing little $XeF_2$ to reach the side walls of the semiconductor substrate 301. As such, the $XeF_2$ is introduced into a reaction chamber designed to allow the XeF₂ to react primarily with the sacrificial material, while preventing or limiting exposure of other silicon elements desired to survive the etch release from being significantly impacted.

In a representative embodiment, the primary reaction occurring between XeF₂ and silicon is:

$$2XeF_2 + S \rightleftharpoons 2Xe(g) + SiF4(g)$$

The sequence of reaction comprises a non-dissociative adsorption of XeF2 at the surface of the (silicon) sacrificial island 321, first sacrificial layer 330, and second sacrificial layer 331. Next, dissociation of the absorbed gas, F₂ occurs, followed by a reaction between the adsorbed atoms and the silicon surface, thereby forming an adsorbed product molecule, SiF₄ (ads). Next, desorption of the product molecule (SiF₄) into the gas phase occurs, followed by volatilization of non-reactive residue (dissociated Xe) from the etched surface. In addition, it is beneficial to use a photoresist protection mask to protect the edge of the second electrode 306 during the XeF₂ release etch. This is removed following release by O₂ ashing. This processing sequence, which is often referred to as a patterned release, includes opening photo resist only at desired areas where the sacrificial layer is exposed so that it reacts with XeF₂. After the release etch step is complete, a resist strip using O₂ ashing is carried out. Among other benefits, O₂ ashing is preferred over a wet resist strip, which could damage the released membranes.

Figure 3E:
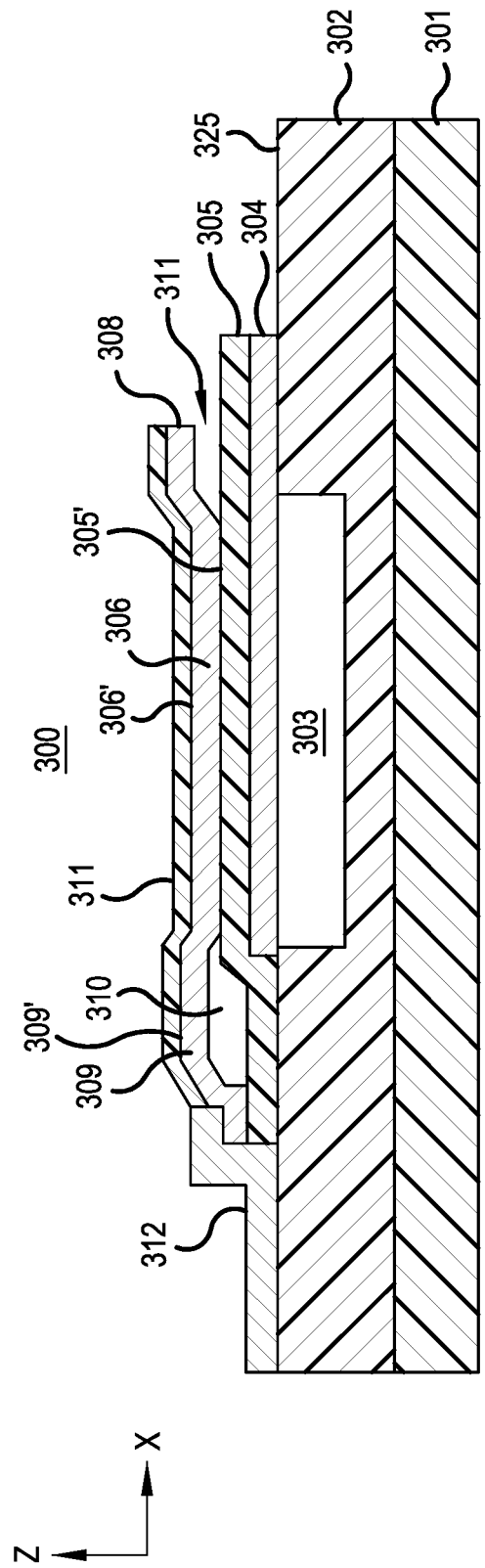

Turning to FIG. 3E, after the release of the sacrificial island 321, the first sacrificial layer 330 and the second sacrificial layer 331, a cavity 303, a cantilevered portion 308 with gap 310, and a bridge 309 with a gap 310 are revealed.

Figure 3F:
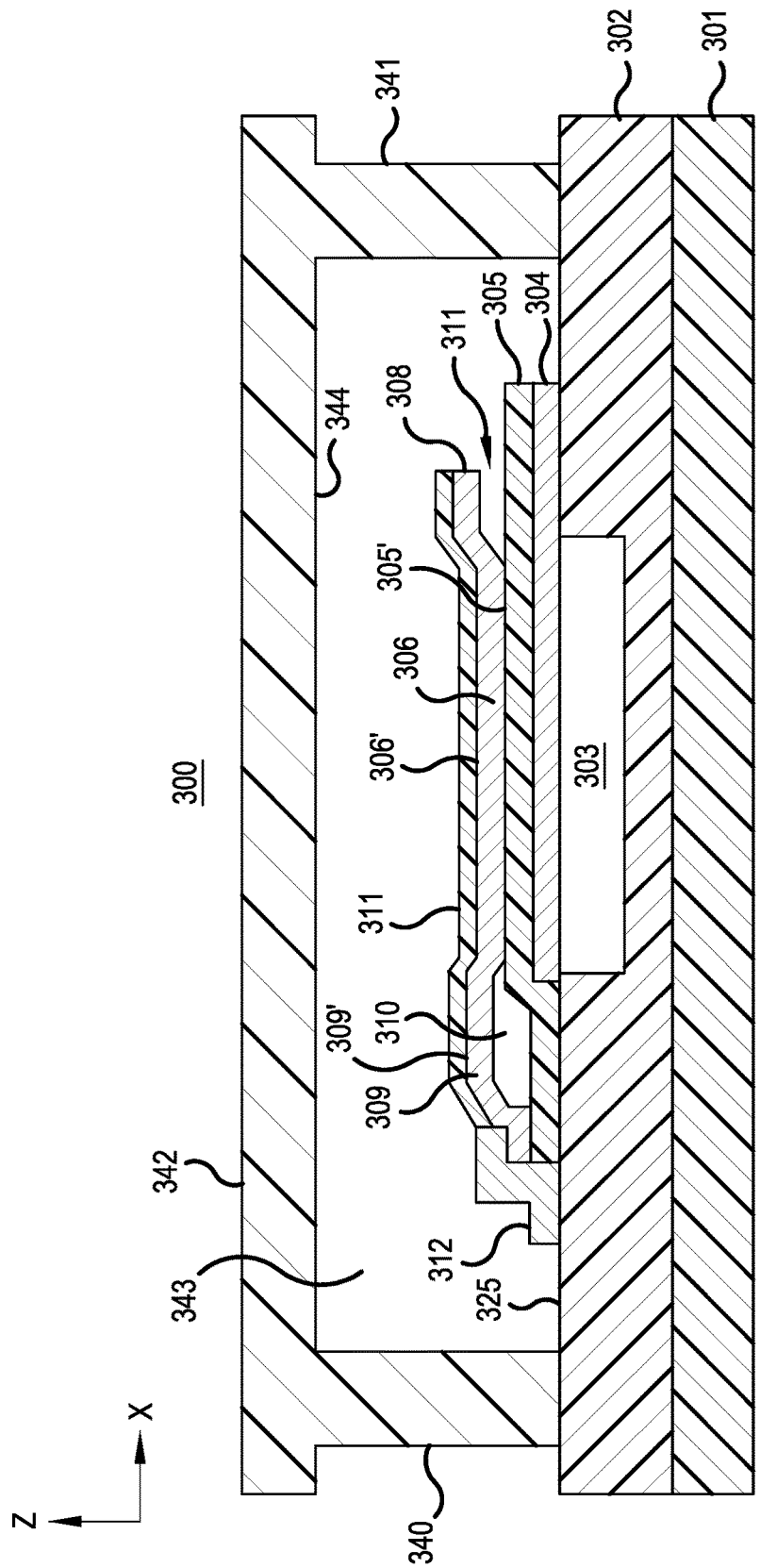

Turning to FIG. 3F, BAW resonator 300 according to a representative embodiment is depicted. The BAW resonator 300 comprises a first polymer post 340, a second polymer post 341, and a polymer lid 342 disposed over the first and second polymer posts 340, 341. The first polymer post 340, the second polymer post 341, and the polymer lid 342 provide a void 343 between an inner surface 344 of the polymer lid 342, and an opposing upper surface 325 of the electrically insulating layer 302. This type of structure, sometimes referred to as a microcap, provides a substantially hermetically sealed void. Beneficially, the polymer microcap structures (first and second posts, and lid) are applied to complete on-wafer capping before singulation and final product construction. Further details of microcap structures according to representative embodiments are described more fully below.

Among other benefits, the polymer microcap further reduces the susceptibility of BAW resonator 300 to IMDs. To this end, in many known microcap structures, the posts and the lids are made of the same semiconductor material as the substrate. These structures, which include carriers, are susceptible to induced currents from electromagnetic radiation in their vicinity. By contrast, the first polymer post 340, the second polymer post 341, and the polymer lid 342 are made of a substantially electrically insulating material, which, like the electrically insulating layer 302, is not susceptible to such induced currents to an appreciable degree. Accordingly, the polymer posts 340, 341 and polymer lid 342 avoids entirely the use of a semiconductor-based microcap, and thus avoids nonlinearities, and particularly second and third order harmonic and intermodulation distortions, that result from the semiconductor-based microcaps. Additional polymer-based packaging solutions are described below with respect to FIGS. 6A to 9B.

Figure 4:
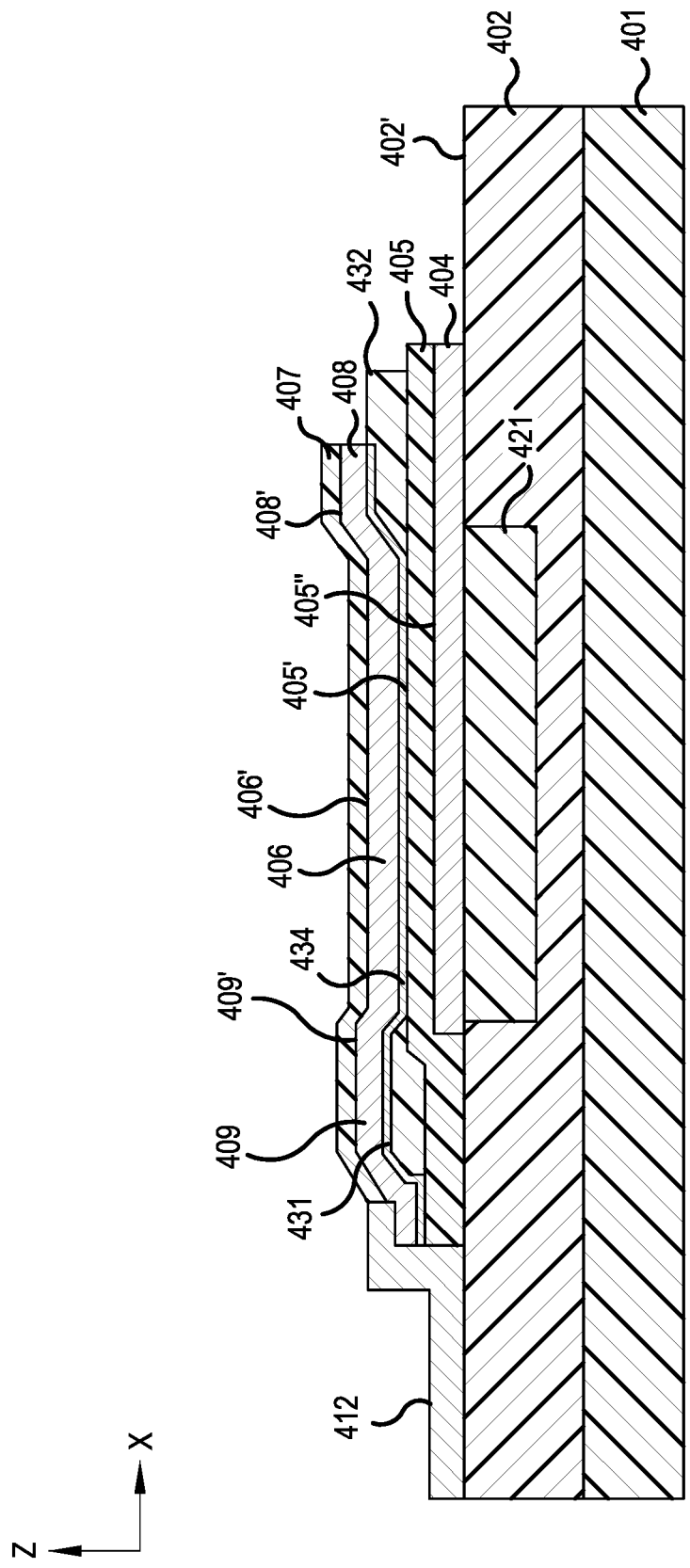
FIG. 4 shows a cross-sectional view of a BAW resonator in accordance with a representative embodiment.

FIG. 4 is a cross-sectional view of a BAW resonator 400 in accordance with a representative embodiment. Many aspects and details (e.g., materials, material characteristics and dimensions) of BAW resonator 400 are common to certain aspects and details of BAW resonators 100, 200, 200' and, 300 described in connection with FIGS. 1-3F. These common aspects and details may not be repeated to avoid obscuring the presently described representative embodiments.

The BAW resonator 400 comprises a semiconductor substrate (sometimes referred to as a layer) 401, an electrically insulating layer 402, and a first electrode 404 in direct contact with an upper surface 402' of the electrically insulating layer 402.

Generally, the electrically insulating layer 402 has an electrical resistivity between approximately $1 \times 10^6$ Ω-m and approximately $5 \times 10^{16}$ Ω-m. In some representative embodiments, it is beneficial to select a material for the electrically insulating layer 402 that has a resistivity of at least $1 \times 10^{12}$. In other representative embodiments, it is it is beneficial to select a material for the electrically insulating layer 402 that has a resistivity that is greater than $10^3$ times that of the semiconductor substrate 401, which is, for example silicon.

Additionally, the electrically insulating layer 402 has a comparatively low relative permittivity ($\varepsilon_r$), which is illustratively in the range of approximately 2.0 to approximately 10.0. Notably, for optimization in some representative embodiments, it may be useful to select a material for electrically insulating layer 402 that has a permittivity in the low end of the noted range of permittivity to provide capacitive decoupling from the semiconductor substrate 401. In some representative embodiments, it is beneficial to select a material for the electrically insulating layer 402 having a relative permittivity ($\varepsilon_r$) that is two (2) to three (3) times less than that of the semiconductor substrate 401, which is, for example silicon. Notably, certain low-k materials, which are generally not mechanically rigid, are viable options since they are made relatively thick, and are disposed over the semiconductor substrate 401 (or other substrate with suitable mechanical strength) and under the components of the BAW resonator 400 disposed thereover.

By way of example, the electrically insulating layer 402 may comprise one or more layers of silicon dioxide (SiO₂), silicon nitride (Si₃N₄), engineered silicon carbide (having a resistivity of at least $10^6$ Ω-m), benzocylcobutene (BCB), polyimide, or non-piezoelectric ('glassy') aluminum nitride (AlN), which also provides comparatively good heat dissipation. Specifically, and as described more fully below, the electrically insulating layer 402 may comprise multiple layers, which may be comprised of the same or different materials.

A piezoelectric layer 405 comprises a lower surface 405" in contact with a first electrode 404 and an upper surface 405' in contact with a second electrode 406.

An optional passivation layer 407 is provided over the second electrode 106. Illustratively, the passivation layer 407 can be made from various types of materials, including aluminum nitride, silicon carbide, BSG, SiO₂, SiN, polysilicon, and the like.

A cantilevered portion 408 of the second electrode 406 is provided over a first sacrificial layer 431 on at least one side of the second electrode 406, and a bridge 409 is provided over a second sacrificial layer 432, and is disposed along the interconnection side 412. In accordance with a representative embodiment, illustrative candidates for the first and second sacrificial layers 431, 432 include, but are not limited, to amorphous or polycrystalline silicon, molybdenum (Mo), tungsten (W), germanium (Ge), SiGe, and titanium tungsten (TiW).

As depicted in FIG. 4, the second electrode 406 comprises an upper surface 406'. As can be seen, the upper surface 406' is disposed substantially at a first height (z-dimension in the coordinate system depicted). Similarly, a cantilevered portion 408 comprises an upper surface 408'. The upper surface 408' is disposed substantially at a second height (again, z-dimension in the coordinate system depicted). The second height is higher than the first height. Thus, the upper surface 406' of the cantilevered portion 408 is raised up relative to the upper surface 206'.

As also depicted in FIG. 4, the bridge 409 has upper surface 409'. The upper surface 409' is disposed substantially at a third height (again, z-dimension in the coordinate system depicted). The third height is higher than the first height. Thus, the upper surface 409' is raised up relative to the upper surface 406'.

As noted above, using the $XeF_2$ release etch as described above is not a viable option when the first and second electrodes 404, 406, the cantilevered portion 408 and the bridge 409 are made of molybdenum, tungsten, or combinations thereof. Specifically, the etchant gas, $XeF_2$, will deteriorate the molybdenum/tungsten components. However, it is often desirable to use these materials for various metal components of BAW resonators. In an effort to prevent the interaction of the $XeF_2$ gas with the molybdenum/tungsten components, a protective layer 434 is disposed on a lower surface of the second electrode 406, and a photoresist mask (not shown) may be disposed over the second electrode 406. The photoresist mask has release openings (not shown) to allow the $XeF_2$ to reach first sacrificial layer 431 and the second sacrificial layer 432. Of course, the sacrificial island 421 is released in the reaction chamber at the same time. In accordance with a representative embodiment, the protective layer 434 is patterned milled by a known technique so it is not present over the upper surface 405' of piezoelectric layer 405.

In accordance with a representative embodiment, the protective layer 434 is illustratively silicon carbide (SiC) or non-piezoelectric aluminum nitride, which substantially prevents the etchant $XeF_2$ from interacting with the second electrode 406, which may be molybdenum, tungsten, or a combination (e.g., alloy or stack) of these materials.

The BAW resonators 100~400 of the present teachings are contemplated for a variety of applications including wireless communication devices, and components thereof. By way of example, and as described in connection with FIG. 5, multiple BAW resonators 100 can be connected in a series/shunt arrangement to provide a ladder filter.

Figure 6A:
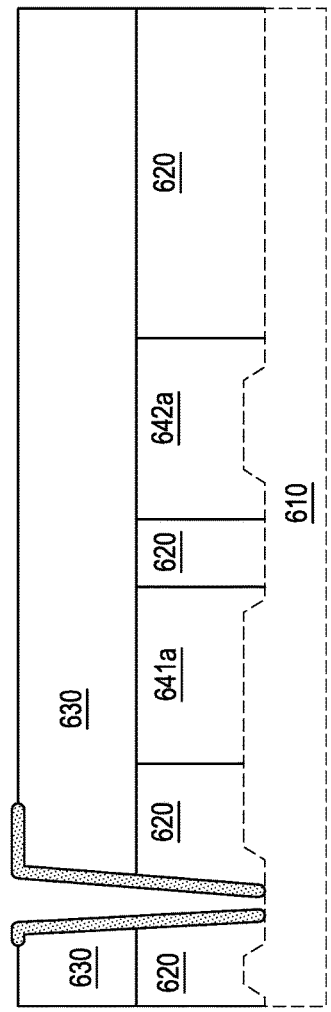
FIG. 6A shows a cross-sectional view of packaging for a resonator in accordance with a representative embodiment.

FIG. 6A shows a cross-sectional view of polymeric air cavity packaging for an FBAR in accordance with a representative embodiment. In FIG. 6A, an FBAR device wafer 610 is provided beneath a first polymeric layer 620. The first polymeric layer 620 is provided beneath a second polymeric layer 630. Polymer package cavities 641a and 642a are formed above the FBAR device wafer 610, by polymeric layers 620 and 630. In FIG. 6A, the FBAR device wafer 610 may comprise a substrate, and the first polymeric layer 620 and the second polymeric layer 630 may each comprise polymer layers formed separately, such as at different times. The first polymeric layer 620 and second polymeric layer 630 may result from dry film resist technologies (DFR), based on permanent photosensitive epoxy resins. A dry film resist polymer-based packaging technology simultaneously permits the dry film resist polymer to reflow around non-planarities in inactive portions of packaged resonators, while remaining planar over FBAR release holes. This is achieved using a dry film resist polymeric package for FBAR devices.

The first polymeric layer 620 may substantially conform to topology of the FBAR device wafer 610, such as by being formed in place above the FBAR device wafer 610. Exceptions to the conformity of the polymeric layer 620 to the FBAR device wafer 610 may be provided as described below.

Figure 6B:
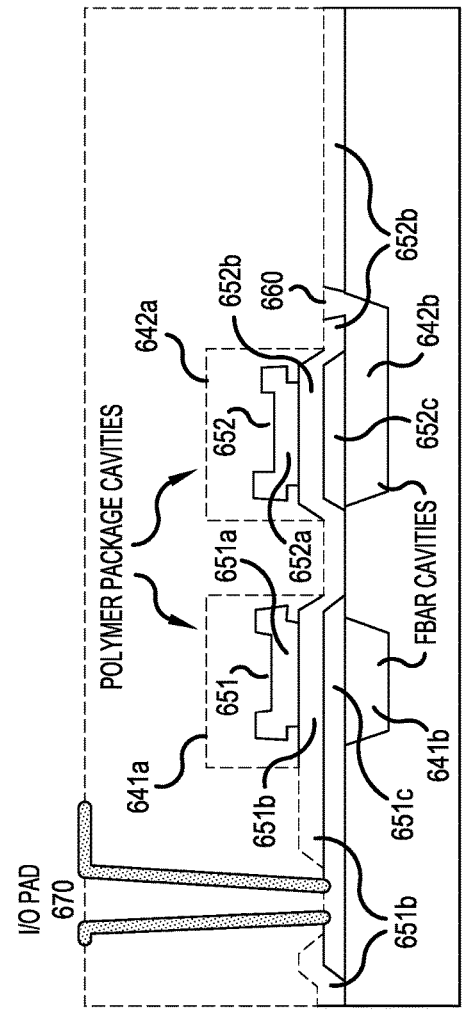
FIG. 6B shows a cross-sectional view of resonators in accordance with a representative embodiment.

FIG. 6B shows a cross-sectional view of FBARs in accordance with a representative embodiment. In FIG. 6B, FBAR 651 includes piezoelectric layer 651b sandwiched below first electrode 651a and above second electrode 651c. FBAR 652 includes piezoelectric layer 652b sandwiched below first electrode 652a and above second electrode 652c. The piezoelectric layers 651b and 652b are shown extending to the right and left edges. In FIG. 6B, release hole 660 is representative of multiple release holes formed through piezoelectric layers 651b and 652b. I/O pad 670 is shown above lining (not labelled) for a through via (not labelled). The release holes 660 effectively surround each FBAR 651, 652. At least three release holes 660 are contemplated for each FBAR 651, 652 in an embodiment. As should be clear, the release holes 660 are formed above the FBAR cavities 641b, 642b, within a periphery formed by the FBAR cavities 641b, 642b. The FBAR cavities 641b, 642b are formed under the acoustic stack of each FBAR 651, 652, under the release holes 660, and under portions of the first polymeric layer 620. The release holes 660 are all entirely covered by the first polymeric layer 620.

In FIG. 6B, a portion of the FBAR device wafer 610 is formed between the FBAR cavities 641b and 642b. For example, FBAR cavities 641b, 642b may be etched out or otherwise created by removing portions of FBAR device wafer 610 before the first polymeric layer 620 is formed or placed over the FBAR device wafer 610.

As shown in FIG. 6b, FBARs 651, 652 can be integrated to form an FBAR-based frequency filter. That is, an FBAR filter may comprise one or more FBAR 651, 652 provided over FBAR cavities 641b, 642b, and provided with associated release holes 660 surrounding each FBAR 651, 652 within a periphery of the corresponding FBAR cavity 641b or 642b.

Figure 6C:
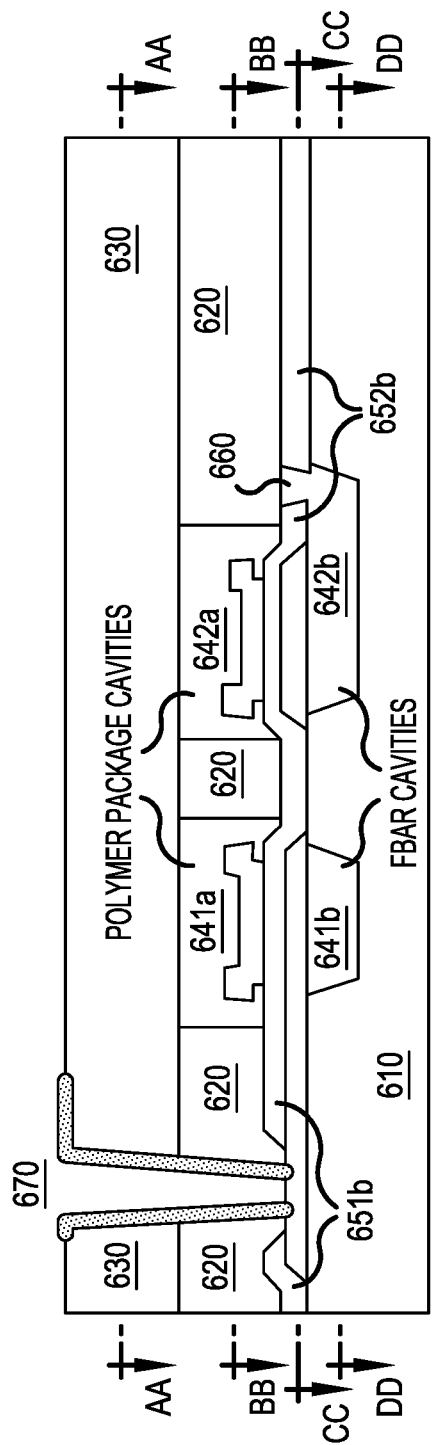
FIG. 6C shows a composite cross-sectional view of the packaging in FIG. 6A and the resonators in FIG. 6B in accordance with a representative embodiment.

FIG. 6C shows a composite cross-sectional view of the packaging in FIG. 6A and the FBARs in FIG. 6B in accordance with a representative embodiment. In FIG. 6C, four labels AA, BB, CC, DD are provided on each side to show cut-out levels for FIGS. 7A-7D below. In FIG. 6C, the release hole 660 is shown below (covered by) the first polymeric layer 620 and in communication with the first FBAR cavity 642b. As shown in FIG. 6C, the first polymeric layer 620 surrounds each FBAR 651, 652, and therefore surrounds the acoustic stack of each FBAR 651, 652. Additionally, the first polymeric layer 620 provides a polymer package cavity 641a, 642a above each FBAR 651, 652, and is therefore above the acoustic stack of each FBAR 651, 652. Of course, the polymer package cavities 641a, 642a formed by the first polymeric layer 620 are also around the first electrodes 651a, 652a, and above the piezoelectric layers 651b, 652b.

Additionally, in FIG. 6C a part or section of the first polymeric layer 620 is shown between the first electrodes 651a and 652a, between the piezoelectric layers 651b and 652b, and between the second electrodes 651c and 652c. That is, the first polymeric layer 620 is shown between different FBARs 651, 652 in FIG. 6C.

As shown in FIG. 6C, the FBAR filter consists of FBARs 651, 652 formed over FBAR cavities 641b, 642b, with associated release holes represented by release hole 660, surrounding the acoustic stacks of the FBARs 651, 652 within a periphery of each FBAR cavity 641b, 642b. As also indicated in FIG. 6C, the polymeric package cavities 641a, 642a that are employed over the FBARs 651, 652 consist of a first polymeric layer 620 and a second polymeric layer 630, though additional polymeric layers may be employed. The second polymeric layer 630 is disposed over the acoustic stack of each FBAR 651, 652, and above the polymer package cavities 641a, 642a formed above and partly around each FBAR 651, 652.

The first polymeric layer 620 may consist of a photodefinable permanent epoxy resin such as Microchem SU-8 and TOK DFR material, and may be patterned using photolithography. There are at least three purposes of the resulting pattern in the first polymeric layer.

The first polymeric layer 620 provides a mechanical support for the polymeric packaging in FIG. 6C, and provides polymer package cavities 641a, 642a for the FBARs 651, 652. The polymer package cavities 641a, 642a may be air gaps used to assure the electrical performance of the FBARs 651, 652, including of Q over frequency, effective coupling coefficient kt2, and precise frequency control.

The first polymeric layer 620 is also compatible with the presence of the FBAR release holes represented by release hole 660. Integration of the first polymeric layer 620 so as not to flow into the release holes 660 may prevent electrical degradation of the FBARs 651, 652 performance. The release holes 660 may be formed before the first polymeric layer 620 in a process such as by using multi exposure and a negative tone dry-film resist (DFR) film laminated over a completed/processed FBAR base wafer 610, where only the resist over release holes 660 is selectively exposed before baking so as to effectively harden the exposed polymer area and plug the release holes 660 before subsequent exposures of the remainder. As noted, the first polymeric layer 620 may conform to the topology of the FBAR device wafer 610, with exceptions around the release holes 660.

The FBARs 651, 652 may also comprise resonator membranes. The first polymeric layer 620 is also absent over membranes of each FBAR 651, 652, but present over all FBAR release holes 660 etc. A portion of a bottom surface of the first polymeric layer 620 over the release holes 660 may be planar, such as if the release holes 660 are hardened by a selective initial exposure as described immediately above. Additionally, the first polymeric layer 620 may be observed to conform to nonplanar topologies that are present on the base FBAR device wafer 610, in all areas except where the FBAR release holes 660 et al. are observed. A unique physical identifier may result from the manufacturing process described above for the polymeric packaging shown in FIGS. 6A and 6C, in that the first polymeric layer 620 will be observed to be present over all release holes 660 et al. and will be more heavily crosslinked in these regions than in the rest of the first polymeric layer 620. That is, the first polymeric layer 620 is more heavily crosslinked and less reflowed into the cavities and release holes 660, while at the same time the first polymeric layer 620 may be more reflowed into non-cavity regions away from the release holes 660. As noted, this may be accomplished by selective crosslinking of a negative-tone photo-sensitive dry-film resist (DFR) film laminated over the FBAR base wafer 610 in the first exposure of a multi-exposure technique.

The first polymeric layer 620 may also be patterned in an arbitrary way so as to provide access to the FBAR device wafer 610 for purposes of I/O feedthroughs to the FBAR device wafer 610, or for purposes of simplifying and reducing the scribe singulation.

As shown in FIGS. 6A and 6C, at least one second polymeric layer 630 is placed over the first polymeric layer 620, to form the polymer package cavities 641a, 642a as effective air cavities over the active FBARs 651, 652. Electrical connections may be made through, over, or around the polymeric package shown in FIG. 6C to permit, for example, a flip attachment of the polymeric package to a PCB substrate or module.

As an example, the packaged FBARs 651, 652 shown in and described with respect to FIGS. 6A-6C may be components of a wireless communications device. The packaged FBARs described herein may provide enhanced RF capabilities for RF communications involving such a wireless communications device.

Figure 7A:
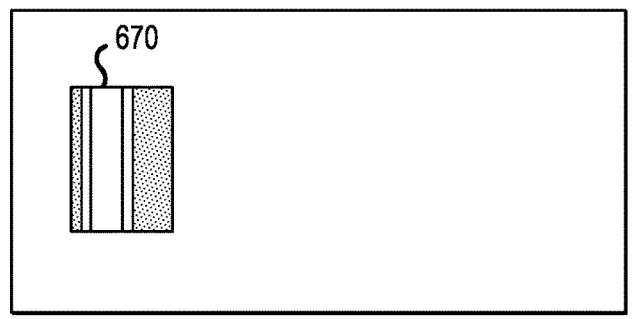
FIG. 7A shows a top view of a packaged resonator in accordance with a representative embodiment.

FIG. 7A shows a top view of a packaged FBAR in accordance with a representative embodiment. In FIG. 7A, a cutout at elevation AA shows only the IO pad 670 and lining (not labelled) in the through via (not labelled) in FIG. 6C.

Figure 7B:
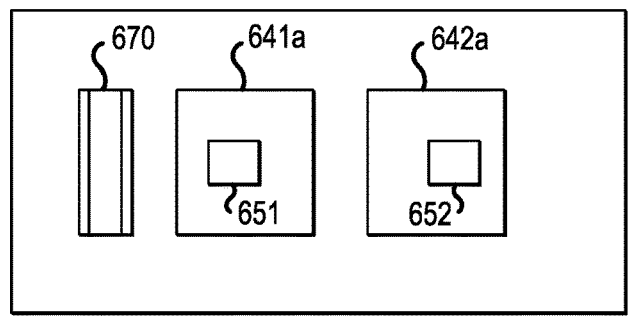
FIGS. 7B-7D show sectional top views of the packaged resonator in FIG. 7A in accordance with a representative embodiment.
Figure 7C:
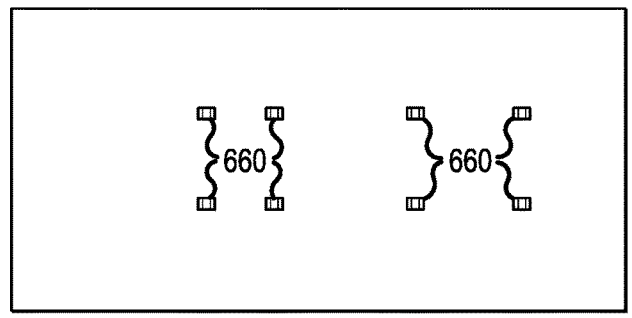
Figure 7D:
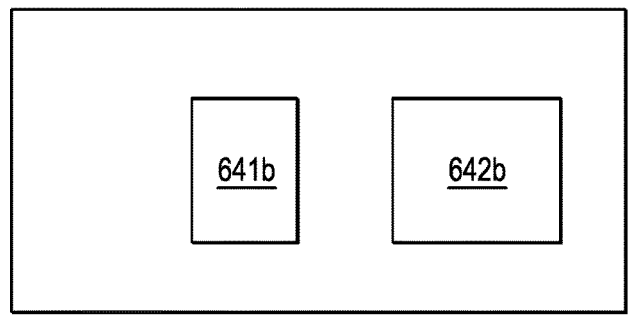

FIGS. 7B-7D show sectional top views of the packaged FBARs in FIG. 7A in accordance with a representative embodiment. In FIG. 7B, a cutout at elevation BB shows the IO pad 670 and lining (not labelled) in the through via (not labelled) in FIG. 6C. The cutout at elevation BB also shows polymer package cavity 641a with FBAR 651, and polymer package cavity 642a with FBAR 652.

In FIG. 7C, a cutout at elevation CC shows multiple release holes 660. The multiple release holes 660 at elevation CC are provided around FBAR 651 and FBAR 652 at elevation BB in FIG. 7B. As an example, the release holes 660 may be provided in a 1-1 relationship with each of the four corners/vertices of the FBARs 651 and 652. Of course, the FBARs 651 and 652 do not necessarily have four corners/vertices, and the release holes 660 are not necessarily provided in a 1-1 relationship with corners/vertices of the FBARs 651 and 652.

In FIG. 7D, a cutout at elevation DD shows only the FBAR cavities 641b and 642b. The FBAR cavities 641b and 642b are provided immediately below FBARs 651 and 652. Additionally, the FBAR cavities 641b and 642b each communicate with four of the release holes 660.

Figure 8:
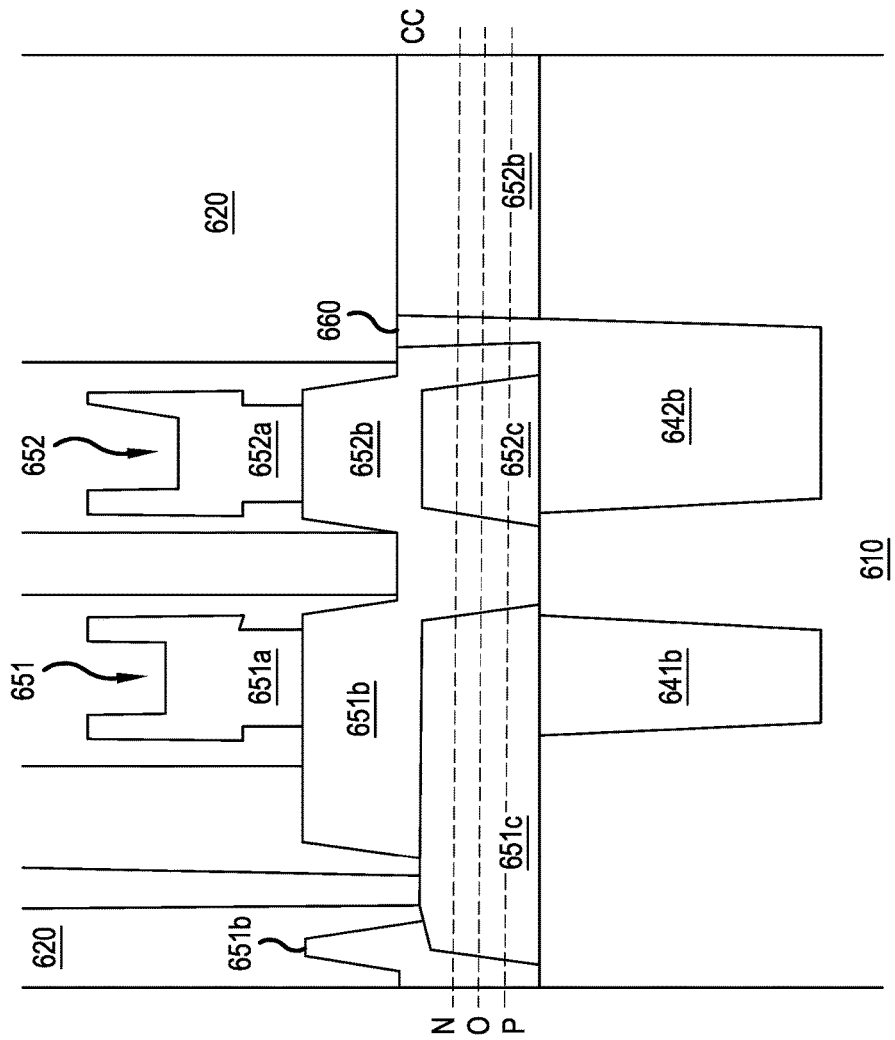
FIG. 8 shows an expanded cross-sectional view of portions of the composite cross-sectional view in FIG. 6C.

FIG. 8 shows an expanded cross-sectional view of portions of the composite cross-sectional view in FIG. 6C. In FIG. 8, three parallel planes "N", "O" and "P" are labelled. The three parallel planes N, O and P each pass through piezoelectric layers 651b, 652b, and the bottom electrodes 651c, 652c. Additionally, the release hole 660 passes through each of the parallel planes N, O and P. The release hole 660 shown in FIG. 8 is representative of multiple release holes 660, and all release holes 660 pass through the parallel planes N, O and P in the embodiment of FIG. 8.

In FIG. 8, the first polymeric layer 620 is present above, and covers, all of the parallel planes N, O and P. The FBAR device waver 610 is present below.

Figure 9A:
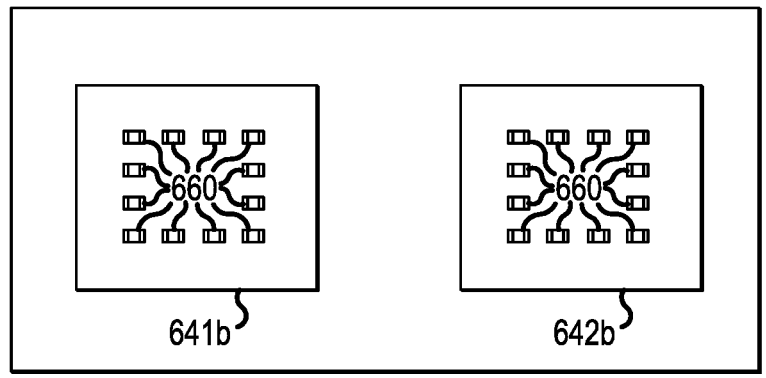
FIG. 9A shows a sectional top view of a packaged resonator in accordance with a representative embodiment.

FIG. 9A shows a sectional top view of a packaged FBAR in accordance with a representative embodiment. In FIG. 9A, twelve release holes 660 are provided in communication with each of two FBAR cavities 641b and 642b. The release holes 660 are all provided through the corresponding piezoelectric layers 651b and 652b (not shown).

Figure 9B:
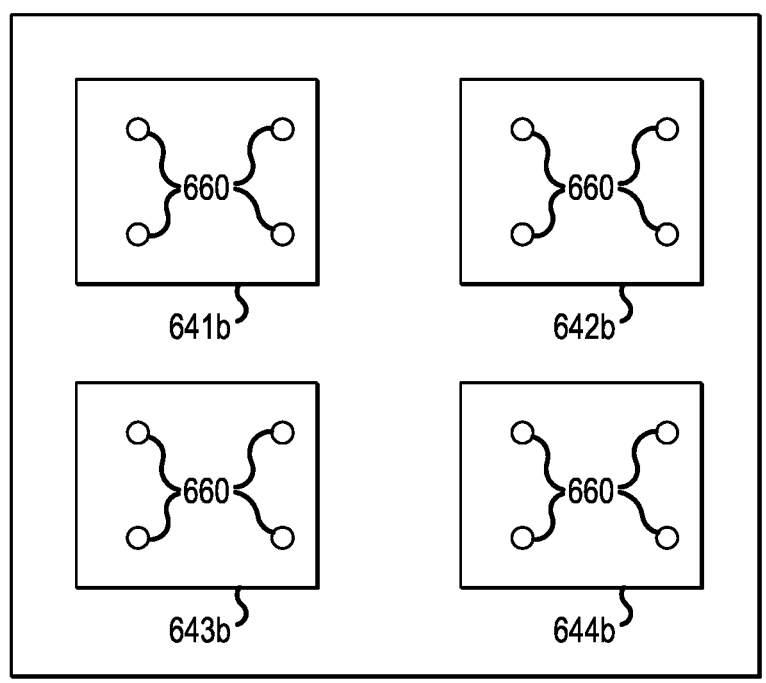
FIG. 9B shows a sectional top view of another packaged resonator in accordance with a representative embodiment.

FIG. 9B shows a sectional top view of another packaged FBAR in accordance with a representative embodiment. In FIG. 9B, four release holes 660 are separately provided for each of four FBAR cavities 641b, 642b, 643b and 644b.

In FIG. 9A, the release holes 660 are shown to be rectangular, whereas in FIG. 9B the release holes 660 are shown to be circular. Additionally, in FIG. 9B the numbers of release holes correspond to the number of vertices of the FBAR cavities 641b, 642b, 643b, 644b, whereas in FIG. 9A there are more release holes 660 than vertices of the FBAR cavities 641b, 642b.

As described above, polymer packaging for a FBAR may result in a first polymeric layer 620 covering all release holes 660 surrounding FBARs, where the release holes 660 each communicate with a respective FBAR cavity 641b, 642b under the FBARs.

The packaged FBAR described above with respect to FIGS. 3F, and 6A through 9B avoids entirely the use of a semiconductor-based microcap, and thus avoids nonlinearities, and particularly second and third order harmonic and intermodulation distortions, that result from the semiconductor-based microcaps. In tests using a standard diagnostic device on a polymeric lid stack as compared to state of the art silicon microcaps, consistently better performance is observed over temperature and power for at least the polymeric lid configurations shown at in FIGS. 6A through 9B.

The packaged FBAR described above with respect to FIGS. 6A through 9B also provides significantly more surface area for the mechanical bond between the first polymer 620 layer to the FBAR base wafer 610 than does the silicon microcap package, or the polymer-based package of FIG. 3F which uses posts. The larger mechanical bond area provides a more effective sealing area and effectively microcaps each individual FBAR 651, 652, as opposed to perimeter gold thermocompression bond in the silicon microcap package, or the use of posts at all as in FIG. 3F. The larger bond area may make the package more mechanically rigid in assembly, and less susceptible to possible thermocompression bond breaches. The polymeric lid package shown in FIGS. 6A and 6C may therefore have potential advantages in terms of robustness in assembly and final package reliability.

The packaged FBAR described above with respect to FIGS. 6A through 9B also bypasses the need for expensive gold thermocompression bonding entirely. Additionally, the avoidance of the high pressure/high temperature thermocompression bond eliminates a potential obstacle to scaling of FBAR devices to even greater wafer sizes beyond 200 mm. To the extent possible, increasing wafer size generally provides an opportunity for improved product cost margins.

Moreover, the use of lithography rather than IR-based mechanical thermocompression alignment provides a route to potentially shrink the product die design rules, which may result in smaller die sizes, more favorable economics, and smaller overall package footprint in the end customer device. Alternatively, the use of a lithographic polymer lid cap via first and second polymeric layers 620, 630 has been shown in preliminary tests to permit slightly larger electrical I/O via dimensions, resulting in reduced parasitic via resistance. Thus, the polymeric package in FIGS. 6A and 6C may provide an ability to trade product size versus electrical performance, potentially at a lower overall sum of the two compared to existing silicon microcap packages.

Additionally, the packaged FBAR described herein substantially avoids air gaps that are present in the singulation scribes for the silicon microcap device. These air gaps are present in the silicon microcap device in the region between the FBAR base wafer and the FBAR microcap wafer, in the scribe regions. In the silicon microcap device, these air gaps require difficult singulation technologies that frequently result in perimeter chip-out, which must be screened by testing in the final product. The polymeric lid package enables complete clearing of the lid package from all singulation scribes, greatly reducing the incidence of chip-out. Reducing chip-out may potentially result in improved product quality, reliability, and reduced quality screening costs.

FIG. 5 shows a simplified schematic block diagram of an electrical filter 500 in accordance with a representative embodiment. The electrical filter 500 comprises series BAW resonators 501 and shunt BAW resonators 502. The series BAW resonators 501 and shunt BAW resonators 502 may each comprise BAW resonators 100 (or BAW resonators 200, 200', or 300, or 400) described in connection with the representative embodiments of FIGS. 1~4. As can be appreciated, the BAW resonator devices (e.g., multiple BAW resonators 100) that comprise the electrical filter 500 may be provided over a common substrate, or may be a number of individual BAW resonator devices (e.g., BAW resonators 100) disposed over more than one substrate (e.g., more than one substrate). The electrical filter 500 is commonly referred to as a ladder filter, and may be used for example in duplexer applications. It is emphasized that the topology of the electrical filter 500 is merely illustrative and other topologies are contemplated. Moreover, the acoustic resonators of the representative embodiments are contemplated in a variety of applications including, but not limited to duplexers. As described above, the material selected for the electrically insulating layers 102, 302, 402 or the electrically insulating substrate 202, has a comparatively high resistivity. Beneficially, providing the layers/substrate with comparatively high resistivity may improve the quality factor (Q) in shunt BAW resonators (e.g., shunt BAW resonators 502) by reducing the shunt current due to their increased shunt resistance.

According to an aspect of the present disclosure, a packaged resonator includes a substrate, an acoustic stack, a first polymer layer, and a second polymer layer. The acoustic stack is disposed over the substrate. The first polymer layer is disposed over the substrate and surrounding the acoustic stack. The first polymer layer also provides a first air gap above the acoustic stack. The second polymer layer is disposed over the acoustic stack and above the first air gap.

According to another aspect of the present disclosure, the packaged resonator includes at least three release holes formed between an air cavity under the acoustic stack and the first polymer layer.

According to still another aspect of the present disclosure, the release holes surround the acoustic stack within a periphery of the air cavity.

According to yet another aspect of the present disclosure, the acoustic stack includes a first electrode, a second electrode, and a piezoelectric layer disposed between the first and second electrode.

According to another aspect of the present disclosure, the release holes are formed through the piezoelectric layer of the acoustic stack.

According to still another aspect of the present disclosure, the first polymer layer covers all of the release holes.

According to yet another aspect of the present disclosure, the first polymer layer substantially conforms to topology of the substrate except for the at least three release holes.

According to another aspect of the present disclosure, the resonator includes a thin film bulk acoustic resonator. The thin film bulk acoustic resonator includes a resonator membrane. The first polymer layer is absent over the resonator membrane.

According to still another aspect of the present disclosure, the acoustic stack includes a first electrode, a second electrode, and a piezoelectric layer disposed between the first and second electrode.

According to yet another aspect of the present disclosure, the acoustic stack is a first acoustic stack. The packaged resonator further includes a second acoustic stack provided over the substrate, and a second air gap formed in the first polymer layer and above the second acoustic stack. The second polymer layer is disposed over the second acoustic stack and above the second air gap.

According to another aspect of the present disclosure, the packaged resonator further includes at least three first release holes between a first air cavity under the first acoustic stack and the first polymer layer, and at least three second release holes between a second air cavity under the second acoustic stack and the first polymer layer. The first polymer layer provides a barrier between the first air gap and the second air gap.

According to an aspect of the present disclosure, a wireless communication device includes a substrate, an acoustic stack, a first polymer layer, and a second polymer layer. The acoustic stack is disposed over the substrate. The acoustic stack includes a first electrode, a second electrode, and a piezoelectric layer disposed between the first and second electrode. The first polymer layer is disposed over the substrate and surrounds the acoustic stack to provide an air gap above the acoustic stack. The second polymer layer is disposed over the acoustic stack and above the air gap.

According to another aspect of the present disclosure, the wireless communication device includes an air cavity disposed below the acoustic stack, and multiple release holes covered by the first polymer layer. At least one release hole is in communication with the air cavity.

According to yet another aspect of the present disclosure, the air cavity exists in the substrate below the acoustic stack. The at least one release hole exists through the piezoelectric layer between the first polymer layer and the air cavity.

According to still another aspect of the present disclosure, the wireless communication device further includes an air cavity and at least one release hole. The air cavity is disposed below the acoustic stack. The at least one release hole is in communication with the air cavity. The first polymer layer covers the at least one release hole.

According to another aspect of the present disclosure, a portion of a bottom surface of the first polymer layer over the at least one release hole is planar.

According to another aspect of the present disclosure, the wireless communication device further includes a layer under the first polymer layer. Portions of the first polymer layer away from the at least one release hole conform to the layer under the first polymer layer.

According to yet another aspect of the present disclosure, the acoustic stack is or includes a thin film bulk acoustic resonator surrounded by the first polymer layer.

According to still another aspect of the present disclosure, a portion of a bottom surface of the first polymer layer covers the at least one release hole is planar.

According to an aspect of the present disclosure, a bulk acoustic resonator includes a substrate, at least one acoustic stack, a first polymer layer, and a second polymer layer. The at least one acoustic stack is disposed over the substrate. Each acoustic stack includes a first electrode, a second electrode, and a piezoelectric layer disposed between the first and second electrode and over an edge of the first electrode to be in direct contact with an upper surface of the substrate. The first polymer layer is disposed over the substrate and surrounds each acoustic stack disposed over the substrate to provide an air gap above each acoustic stack. The second polymer layer is disposed over each acoustic stack and above each air gap. At least three release holes exist through the piezoelectric layer of each acoustic stack and between an air cavity under each acoustic stack and the first polymer layer.

In accordance with illustrative embodiments, BAW resonators for various applications, such as in electrical filters and other components of wireless communication devices, are described. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to make or use the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

We claim:

1. A packaged resonator, comprising:
    a substrate;
    an acoustic stack disposed over the substrate;
    a first polymer layer disposed over the substrate, surrounding the acoustic stack, and providing a first air gap above the acoustic stack;
    a second polymer layer disposed over the acoustic stack and above the first air gap; and
    at least three release holes disposed between an air cavity under the acoustic stack, and the first polymer layer, wherein the first polymer layer covers each of the at least three release holes.

2. The packaged resonator of claim 1, wherein the at least three release holes surround the acoustic stack within a periphery of the air cavity.

3. The packaged resonator of claim 1, wherein the acoustic stack comprises a first electrode, a second electrode, and a piezoelectric layer disposed between the first and second electrode.

4. The packaged resonator of claim 3,
wherein the at least three release holes are formed through the piezoelectric layer of the acoustic stack.

5. The packaged resonator of claim 1,
wherein the first polymer layer substantially conforms to topology of the substrate except for the at least three release holes.

6. The packaged resonator of claim 1,
wherein the packaged resonator comprises a thin film bulk acoustic resonator,
the thin film bulk acoustic resonator comprises a resonator membrane, and
the first polymer layer is absent over the resonator membrane.

7. The packaged resonator of claim 1,
wherein the acoustic stack comprises a first electrode, a second electrode, and a piezoelectric layer disposed between the first and second electrode.

8. The packaged resonator of claim 1, wherein the acoustic stack is a first acoustic stack, and the packaged resonator further comprising:
a second acoustic stack provided over the substrate;
a second air gap formed in the first polymer layer and above the second acoustic stack,
wherein the second polymer layer is disposed over the second acoustic stack and above the second air gap.

9. The packaged resonator of claim 8, further comprising:
at least three first release holes between a first air cavity under the first acoustic stack and the first polymer layer, and
at least three second release holes between a second air cavity under the second acoustic stack and the first polymer layer,
wherein the first polymer layer provides a barrier between the first air gap and the second air gap.

10. A wireless communication device, comprising:
a substrate;
an acoustic stack disposed over the substrate, wherein the acoustic stack comprises a first electrode, a second electrode, and a piezoelectric layer disposed between the first and second electrode;
an air cavity disposed below the acoustic stack;
a first polymer layer disposed over the substrate and surrounding the acoustic stack to provide an air gap above the acoustic stack; and
a second polymer layer disposed over the acoustic stack and above the air gap; and
at least one release hole in communication with the air cavity, wherein the first polymer layer covers the at least one release hole.

11. The wireless communication device of claim 10, further comprising:
a plurality of release holes covered by the first polymer layer.

12. The wireless communication device of claim 10,
wherein the air cavity exists in the substrate below the acoustic stack, and
the at least one release hole exists through the piezoelectric layer between the first polymer layer and the air cavity.

13. The wireless communication device of claim 10,
wherein a portion of a bottom surface of the first polymer layer over the at least one release hole is planar.

14. The wireless communication device of claim 13, further comprising:
a layer under the first polymer layer,
wherein portions of the first polymer layer away from the at least one release hole conform to the layer under the first polymer layer.

15. The wireless communication device of claim 10,
wherein the acoustic stack comprises a thin film bulk acoustic resonator surrounded by the first polymer layer.

16. The wireless communication device of claim 10,
wherein a portion of a bottom surface of the first polymer layer covering the at least one release hole is planar.

17. A bulk acoustic resonator, comprising:
a substrate;
at least one acoustic stack disposed over the substrate, each acoustic stack including a first electrode, a second electrode, and a piezoelectric layer disposed between the first and second electrode and over an edge of the first electrode to be in direct contact with an upper surface of the substrate;
a first polymer layer disposed over the substrate and surrounding each acoustic stack disposed over the substrate to provide an air gap above each acoustic stack;
a second polymer layer disposed over each acoustic stack and above each air gap; and
at least three release holes exist through the piezoelectric layer of each acoustic stack and between an air cavity under each acoustic stack and the first polymer layer, wherein the first polymer layer covers each of the at least three release holes.

* * * * *